United States Patent
Sera

(10) Patent No.: US 7,015,084 B2
(45) Date of Patent: Mar. 21, 2006

(54) METHOD OF MANUFACTURING A FIELD EFFECT TRANSISTOR AND A LIQUID CRYSTAL DISPLAY USING THE SAME

(75) Inventor: Kenji Sera, Tokyo (JP)

(73) Assignee: NEC Corporation, Tokyo (JP)

( * ) Notice: Subject to any disclaimer, the term of this patent is extended or adjusted under 35 U.S.C. 154(b) by 17 days.

(21) Appl. No.: 10/893,298

(22) Filed: Jul. 19, 2004

(65) Prior Publication Data

US 2004/0266150 A1  Dec. 30, 2004

Related U.S. Application Data

(62) Division of application No. 10/207,765, filed on Jul. 31, 2002, now Pat. No. 6,784,456.

(30) Foreign Application Priority Data

Aug. 1, 2001  (JP) ............... 2001-233256

(51) Int. Cl.
*H01I 21/336* (2006.01)
*H01L 21/8234* (2006.01)
(52) U.S. Cl. .................. 438/197; 438/208; 438/795
(58) Field of Classification Search ........... 438/197, 438/183, 201, 159, 166, 309, 308, 795, 942, 438/949
See application file for complete search history.

(56) References Cited

U.S. PATENT DOCUMENTS 6,392,730 B1 *  5/2002  Ohta et al. .................. 349/139
6,784,456 B1 *  8/2004  Sera .............................. 257/70

FOREIGN PATENT DOCUMENTS

| EP | 0 602 250 | 6/1994 |
|----|-----------|--------|
| EP | 0 645 802 | 3/1995 |
| EP | 1 041 641 | 10/2000 |
| JP | 05082552 | 4/1993 |
| JP | 5-251465 | 9/1993 |
| JP | A 8-153875 | 6/1996 |
| JP | A 8-222736 | 8/1996 |
| JP | 2000-138374 | 5/2000 |

OTHER PUBLICATIONS

Tsukamoto et al., Selective Laser Annealing (SELA) Uses In The Fabrication Of Sub-0.1 $\mu$M MOSFETs, Solid-State Electronics, vol. 42, No. 4, 1998, pp 547-556.

Ohgata et al., "A new dopant activation technique for poly-Si TFTs with a self-aligned gate-overlapped LDD structure", IEEE, 2000, pp. 205-208.

\* cited by examiner

*Primary Examiner*—David Nhu
(74) *Attorney, Agent, or Firm*—Young & Thompson

(57) ABSTRACT

A gate-overlap-drain structure is obtained by a single pair of a single impurity implantation process and a single laser anneal process, wherein the improved gate-overlap-drain structure includes lightly activated high impurity concentration regions exhibiting substantially the same function as the lightly doped drain regions, wherein the lightly activated high impurity concentration regions are bounded with high impurity concentration regions serving as source and drain regions. The boundaries are self-aligned to edges of a gate electrode. Side regions of the gate electrode overlap the lightly activated high impurity concentration regions.

11 Claims, 31 Drawing Sheets conventional gate-overlap-drain structure improved gate-overlap-drain structure

METHOD OF MANUFACTURING A FIELD EFFECT TRANSISTOR AND A LIQUID CRYSTAL DISPLAY USING THE SAME

CROSS REFERENCE TO RELATED APPLICATIONS

This application is a division of application Ser. No. 10/207,765, filed on Jul. 31, 2002 now U.S. Pat. No. 6,784,456, the entire contents of which are hereby incorporated by reference.

BACKGROUND OF THE INVENTION

1. Field of the Invention

The present invention relates to a field effect transistor with an improved gate overlap drain structure and a method of manufacturing the same by utilizing a laser beam irradiation technique as well as a liquid crystal display using the same and a method of manufacturing the same.

All of patents, patent applications, patent publications, scientific articles and the like, which will hereinafter be cited or identified in the present application, will, hereby, be incorporated by references in their entirety in order to describe more fully the state of the art, to which the present invention pertains.

2. Description of the Related Art

In recent years, shrinkage of the semiconductor device causes shortening a gate width of a field effect transistor. The shortened gate width may cause short channel effects and hot carrier injections, thereby resulting in deterioration of reliability of the field effect transistor. The short channel effects and the hot carrier injections may cause an extensively high field in the vicinity of the drain region of the transistor. In order to avoid the above undesired problems, it is effective to reduce or relax an extensively high field in the vicinity of the drain region of the transistor. In order to reduce or relax an extensively high field, a lightly doped drain (LLD) structure is effective, which has been known in the art, to which the present invention pertains. In accordance with the lightly doped drain (LLD) structure, off-set gate layers having lower impurity concentration are selectively formed in selected substrate regions between source/drain regions and a channel region under a gate electrode. The off-set gate layers contribute to relax undesired extensively high fields in the selected substrate regions between the source/drain regions and the channel region under the gate electrode. The off-set gate layers thus contribute to increase the withstand voltages, for example, a punch-through voltage and a hot carrier withstand voltage.

A method of forming a typical example of a conventional lightly doped drain structure will be described with reference to FIGS. 1A through 1C.

As shown in FIG. 1A, an isolation oxide film 14 is selectively formed over a silicon substrate 13 by a local oxidation of silicon method, thereby to define a field region which is surrounded by the isolation oxide film 14. A gate oxide film 4 is formed on the field region by a thermal oxidation. A polysilicon film is then deposited by a low pressure chemical vapor deposition method over the gate oxide film 4 and the isolation oxide film 14. A photolithography and a subsequent dry etching process are then carried out to form a gate electrode 5. A first ion-implantation is then carried out at a low impurity concentration by use of the gate electrode 5 and the isolation oxide film 14 as masks for subsequent anneal under predetermined conditions to form low impurity concentration regions 16.

As shown in FIG. 1B, a silicon oxide film is deposited by a low pressure chemical vapor deposition method over the gate electrode 5 and the isolation oxide film 14 as well as the low impurity concentration regions 16. An anisotropic etching such as a dry etching is then carried out to etch-back the silicon oxide film, thereby to selectively form side wall oxide films 17 on opposite side walls of the gate electrode 5.

As shown in FIG. 1C, a second ion-implantation is carried out at a high impurity concentration by use of the gate electrode 5, the side wall oxide films 17 and the isolation oxide film 14 as masks for subsequent anneal under predetermined conditions to form high impurity concentration regions 18, while the low impurity concentration regions 16 remain only under the side wall oxide films 17, wherein boundaries between the high impurity concentration regions 18 and the low impurity concentration regions 16 are self-aligned to the outside edges of the side wall oxide films 17. The high impurity concentration regions 18 serve as source and drain regions, while the remaining low impurity concentration regions 16 under the side wall oxide films 17 serve as the off-set gate layers.

The above lightly doped drain structure is, indeed, effective to relax the expensively high field concentration. Further high degree of shrinkage of the semiconductor device causes a further high degree of shortening the gate width which defines the channel width, namely of shortening the channel width. Increase in the degree of shortening the channel width may cause an undesired phenomenon that hot carriers generated in the vicinity of the drain region are trapped into side regions of the gate oxide film in the vicinity of the lightly doped drain regions or the low impurity concentration regions 16. The trapped hot carriers may cause an undesired inversion in the conductivity type of the lightly doped drain regions 16. The inversion in the conductivity type of the lightly doped drain regions 16 may cause an undesired variation in threshold voltage of the transistor and also an undesired drop of the punch-through withstand voltage.

In the meantime, it has been known in the art, to which the present invention pertains, a thin film transistor as typical one of the field effect transistors is used as a switching device for a liquid crystal display. In accordance with a basic structure of a polycrystal silicon thin film transistor used as a pixel switching transistor in the liquid crystal display, the lightly doped drain structure is effective to suppress or reduce a leakage of current, which may be a dark current. This lightly doped drain structure and the channel region of the polycrystal silicon thin film transistor have an disadvantage in possible increase in leakage of current or dark current upon incidence of light into the channel region, namely an off-leak current upon incidence of light into the channel region.

In order to reduce such undesired off-leak current upon incidence of light into the channel region, a pair of top and bottom light shielding layers is provided, wherein the top light shielding layer overlies the transistor, while the bottom light shielding layer underlies the transistor. As described above, in accordance with the lightly doped drain structure, the low impurity concentration regions are not covered by the gate electrode. This structure allows a light reflected by respective layers in an active matrix substrate of the display to become incident into the low impurity concentration regions, even the top and bottom optical shielding layers are provided. Namely, it is difficult to avoid the undesirable leakage of light or possible incidence of light into the low impurity concentration regions unless the low impurity concentration regions are completely covered by the gate electrode. This problem will be remarkable in a light valve active matrix liquid crystal display for liquid crystal light projection.

In order to have attempted to solve the above problems with the undesired possible trap of the hot carriers into the gate oxide film and with the undesired possible light incidence into the low impurity concentration regions, a gate-overlap-drain structure was proposed, wherein laminations of a gate insulation film and a gate electrode extend over the lightly doped drain structure, or over the low impurity concentration regions. This gate-overlap-drain structure is disclosed in Japanese laid-open patent publications Nos. 8-153875 and 8-222736. This gate-overlap-drain structure will be described.

FIGS. 2A through 2D are fragmentary cross sectional elevation views of field effect transistors in sequential steps involved in a typical example of a conventional method of forming a gate-overlap-drain structure.

As shown in FIG. 2A, an isolation oxide film 14 is selectively formed over a silicon substrate 13 by a local oxidation of silicon method, thereby to define a field region which is surrounded by the isolation oxide film 14. A gate oxide film 4 is formed on the field region by a thermal oxidation. A resist pattern 10 is selectively formed in the field region, wherein the resist pattern 10 has a smaller size than an intended size of a gate electrode to be formed in later. A first ion-implantation is then carried out at a low impurity concentration by use of the resist pattern 10 and the isolation oxide film 14 as masks for subsequent anneal under predetermined conditions to form low impurity concentration regions 16. After the first ion-implantation is completed, then the used resist pattern 10 is removed.

As shown in FIG. 2B, a polysilicon film is then deposited by a low pressure chemical vapor deposition method over the gate oxide film 4 and the isolation oxide film 14. A photo-lithography and a subsequent dry etching process are then carried out to form a gate electrode 5 which has a larger size than the above-described resist pattern 10 which was already been removed, so that side regions of the gate electrode 5 overlap inside regions of the low impurity concentration regions 16.

As shown in FIG. 2C, a second ion-implantation is carried out at a high impurity concentration by use of the gate electrode 5 and the isolation oxide film 14 as masks for subsequent anneal under predetermined conditions to form high impurity concentration regions 18, while the low impurity concentration regions 16 remain only under the overlap side regions of the gate electrode 5, wherein boundaries between the high impurity concentration regions 18 and the low impurity concentration regions 16 are self-aligned to the outside edges of the gate electrode 5. The high impurity concentration regions 18 serve as source and drain regions, while the remaining low impurity concentration regions 16 under the side regions of the gate electrode 5 serve as the off-set gate layers. The side regions of the gate electrode 5 overlap the remaining low impurity concentration regions 16, thereby forming a gate-overlap-drain structure.

As shown in FIG. 2D, an inter-layer insulator 6 is deposited over the gate electrode 5, the gate oxide film 4 and the isolation oxide film 14. Contact holes are selectively formed in the inter-layer insulator 6 and over the high impurity concentration regions 18 serving as the source and drain regions. Source and drain electrodes 7 are selectively formed within the contact holes and over the inter-layer insulator 6, so that the source and drain electrodes 7 are in contact with the high impurity concentration regions 18 serving as the source and drain regions, thereby forming a field effect transistor including a gate-overlap-drain structure.

FIGS. 3A through 3D are fragmentary cross sectional elevation views of field effect transistors in sequential steps involved in another typical example of a conventional method of forming another gate-overlap-drain structure. This conventional technique is disclosed in Japanese laid-open patent publication No. 8-153875.

As shown in FIG. 3A, an isolation oxide film 14 is selectively formed over a silicon substrate 13 by a local oxidation of silicon method, thereby to define a field region which is surrounded by the isolation oxide film 14. A gate oxide film 4 is formed on the field region by a thermal oxidation. A polysilicon film is then deposited by a low pressure chemical vapor deposition method over the gate oxide film 4 and the isolation oxide film 14. A photo-lithography and a subsequent dry etching process are then carried out to form a gate electrode 5. A first ion-implantation is then carried out at a low impurity concentration by use of the gate electrode 5 and the isolation oxide film 14 as masks for subsequent anneal under predetermined conditions to form low impurity concentration regions 16.

As shown in FIG. 3B, a silicon-based film is entirely formed over the gate electrode 5 and the isolation oxide film 14 as well as the low impurity concentration regions 16. An anisotropic etching is then carried out to etch-back the silicon oxide film, thereby to selectively form side wall conductive films 19 on opposite side walls of the gate electrode 5. The side wall silicon-based films 19 are electrically conductive, for which reason the side wall conductive films 19 serve as part of the gate electrode in cooperation with the gate electrode 5.

As shown in FIG. 3C, a second ion-implantation is carried out at a high impurity concentration by use of the gate electrode 5, the side wall conductive films 19 and the isolation oxide film 14 as masks for subsequent anneal under predetermined conditions to form high impurity concentration regions 18, while the low impurity concentration regions 16 remain only under the side wall conductive films 19, wherein boundaries between the high impurity concentration regions 18 and the low impurity concentration regions 16 are self-aligned to boundaries between the side wall conductive films 19 and the gate electrode 5. The high impurity concentration regions 18 serve as source and drain regions, while the remaining low impurity concentration regions 16 under the side wall conductive films 19 serve as the off-set gate layers, thereby forming a gate-overlap-drain structure.

As shown in FIG. 3D, an inter-layer insulator 6 is deposited over the gate electrode 5, the side wall conductive films 19, the gate oxide film 4 and the isolation oxide film 14. Contact holes are selectively formed in the inter-layer insulator 6 and over the high impurity concentration regions 18 serving as the source and drain regions. Source and drain electrodes 7 are selectively formed within the contact holes and over the inter-layer insulator 6, so that the source and drain electrodes 7 are in contact with the high impurity concentration regions 18 serving as the source and drain regions, thereby forming a field effect transistor including a gate-overlap-drain structure.

In accordance with the above described conventional gate-overlap-drain structure, the side regions of the gate electrode overlap the lightly doped drain regions. This conventional gate-overlap-drain structure may prevent the above-described undesired influence of the hot carriers generated in the vicinity of the drain region. Further, the lightly doped drain regions are covered by the side regions of the gate electrode, wherein the side regions of the gate electrode serve as light shielding regions and improves a light-shieldability. Namely, the conventional gate-overlap-drain structure reduces the above problem with the light leakage.

The above-described conventional method for forming the conventional gate-overlap-drain structure, however, need at least two ion-implantation processes and further additional processes for forming the lightly doped drain regions under the side regions of the gate electrode. This results in complicated necessary processes for forming the conventional gate-overlap-drain structure.

Further, the anneal is carried out after the impurity has been selectively implanted, wherein the anneal reduces or relaxes an abruptness of the impurity concentration profile. This abruptness of the impurity concentration profile may cause an expensive highly field concentration, for which reason the reduction or the relaxation of the abruptness of the impurity concentration profile is effective to reduce or relax the expensive highly field concentration. FIG. 4 is a diagram of an impurity concentration profile across the channel region, the low impurity concentration region and the high impurity concentration region of the field effect transistor having the gate-overlap drain structure. As shown in FIG. 4, the impurity concentration profile includes two step-like variations in the impurity concentration at respective boundaries between the channel region and the low impurity concentration region and between the low impurity concentration region and the high impurity concentration region. Lager variation in the impurity concentration may cause a high field concentration. This impurity concentration profile with the two step-like variations makes it difficult to achieve a sufficient relaxation of the field concentration.

Furthermore, the above impurity concentration profile includes the abrupt step-like variation in impurity concentration at the boundary between the low impurity concentration region and the high impurity concentration region. This abrupt step-like variation in impurity concentration causes an undesirable abrupt and large variation in energy level at the boundary between the low impurity concentration region and the high impurity concentration region. Such abrupt and large variation in energy level promotes an undesired carrier trap, and a carrier re-combination, resulting in a shortened carrier life time.

In the above circumstances, the development of a novel field effect transistor free from the above problems is desirable.

SUMMARY OF THE INVENTION

Accordingly, it is an object of the present invention to provide a novel field effect transistor with an improved gate overlap drain structure free from the above problems.

It is a further object of the present invention to provide a novel field effect transistor with an improved gate overlap drain structure which may be formed in a reduced number of processes.

It is a still further object of the present invention to provide a novel field effect transistor with an improved gate overlap drain structure which provides such a relatively gentle effective impurity concentration profile free of any step-like abrupt variation in impurity concentration as relaxing a high field concentration.

It is yet a further object of the present invention to provide a novel field effect transistor with an improved gate overlap drain structure which provides such a relatively gentle effective impurity concentration profile as avoiding any shortened carrier life-time.

It is another object of the present invention to provide a novel method of forming an improved gate overlap drain structure of a field effect transistor, which is free from the above problems.

It is further another object of the present invention to provide a novel method of forming an improved gate overlap drain structure of a field effect transistor, which may be formed in a reduced number of processes.

It is still further another object of the present invention to provide a novel method of forming an improved gate overlap drain structure of a field effect transistor, which provides such a relatively gentle effective impurity concentration profile free of any step-like abrupt variation in impurity concentration as relaxing a high field concentration.

It is yet further another object of the present invention to provide a novel method of forming an improved gate overlap drain structure of a field effect transistor, which provides such a relatively gentle effective impurity concentration profile as avoiding any shortened carrier life-time.

It is an additional object of the present invention to provide a novel liquid crystal display including a field effect transistor with an improved gate overlap drain structure, which is free from the above problems.

It is a further additional object of the present invention to provide a novel liquid crystal display including a field effect transistor with an improved gate overlap drain structure, which may be formed in a reduced number of processes.

It is a still further additional object of the present invention to provide a novel liquid crystal display including a field effect transistor with an improved gate overlap drain structure, which provides such a relatively gentle effective impurity concentration profile free of any step-like abrupt variation in impurity concentration as relaxing a high field concentration.

It is yet a further additional object of the present invention to provide a novel liquid crystal display including a field effect transistor with an improved gate overlap drain structure, which provides such a relatively gentle effective impurity concentration profile as avoiding any shortened carrier life-time.

It is moreover additional object of the present invention to provide a novel method of forming a liquid crystal display including a field effect transistor with an improved gate overlap drain structure, which is free from the above problems.

It is further more additional object of the present invention to provide a novel method of forming a liquid crystal display including a field effect transistor with an improved gate overlap drain structure, which may be formed in a reduced number of processes.

It is still more additional object of the present invention to provide a novel method of forming a liquid crystal display including a field effect transistor with an improved gate overlap drain structure, which provides such a relatively gentle effective impurity concentration profile free of any step-like abrupt variation in impurity concentration as relaxing a high field concentration.

It is yet more additional object of the present invention to provide a novel method of forming a liquid crystal display including a field effect transistor with an improved gate overlap drain structure, which provides such a relatively gentle effective impurity concentration profile as avoiding any shortened carrier life-time.

The present invention provides an improved gate-overlap-drain structure for a field effect transistor by a single pair of a single impurity implantation process and a single laser anneal process, wherein the improved gate-overlap-drain structure includes lightly activated high impurity concentration regions exhibiting substantially the same function as the lightly doped drain regions, wherein the lightly activated high impurity concentration regions are bounded with high impurity concentration regions serving as source and drain regions. The boundaries are self-aligned to edges of a gate electrode. Side regions of the gate electrode overlap the lightly activated high impurity concentration regions.

After a selective ion-implantation is carried out to form a high impurity concentration region, then a selective laser beam irradiation is carried out to a selected region of the high impurity concentration region for causing complete activation of the impurity in the laser-irradiated region of the high impurity concentration region, while causing incomplete activation of the impurity in the remaining heat-diffused region free from the laser irradiation in the high impurity concentration region. The completely or heavily activated region of the high impurity concentration region serve as the source/drain regions, while the incompletely or lightly activated region of the high impurity concentration region serve as the lightly doped drain regions.

The lightly activated region has the same high impurity concentration as the source and drain regions, for which reason the lightly activated region is distinctly different from the lightly doped drain region which has a lower impurity concentration than the source and drain regions. The lightly activated high impurity concentration region, however, has a low concentration of effectively activated impurity which contributes to electrical conductivity because of the incomplete or light activation. Namely, only part of the actually implanted impurity is effectively activated and serves as effective carrier, while the remaining part of the actually implanted impurity does not serve as the carrier.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DETAILED DESCRIPTION OF THE PREFERRED EMBODIMENTS

Figure 1A:
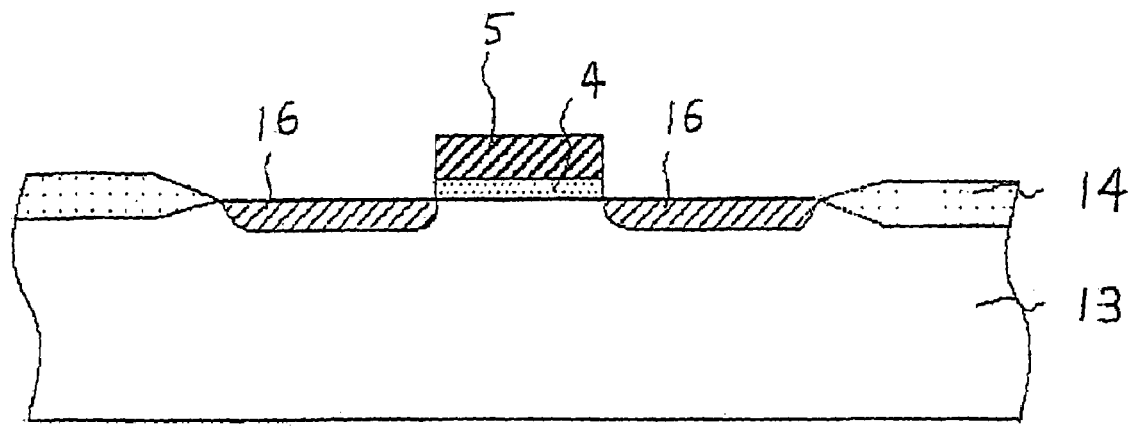
FIGS. 1A through 1C are fragmentary cross sectional elevation views of field effect transistors in sequential steps involved in a conventional method of forming a typical example of a conventional lightly doped drain structure.
Figure 1B:
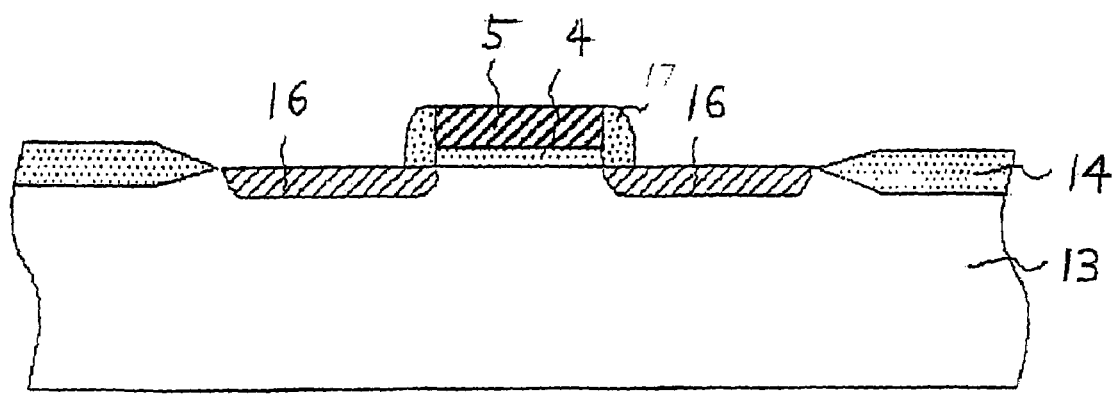
Figure 1C:
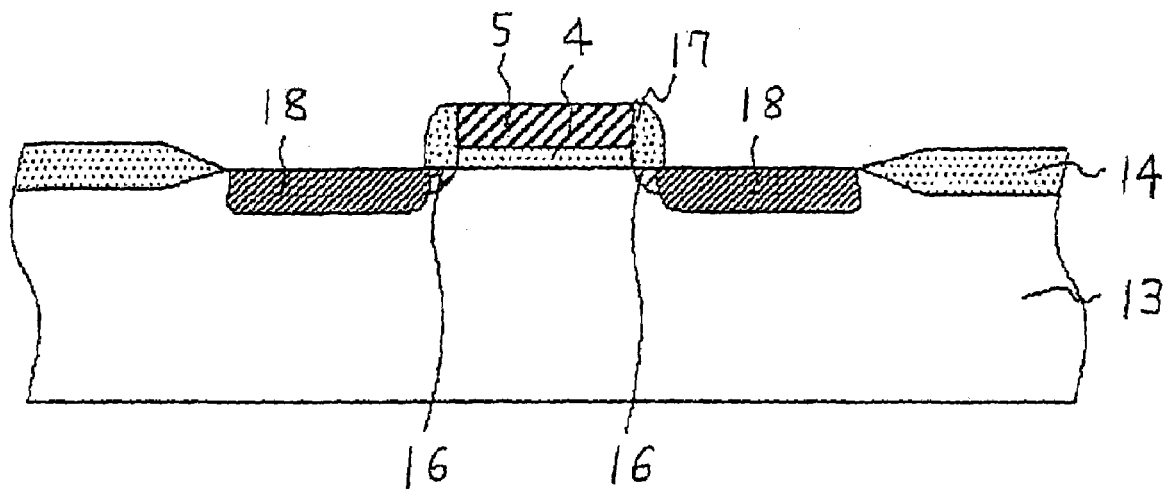
Figure 2A:
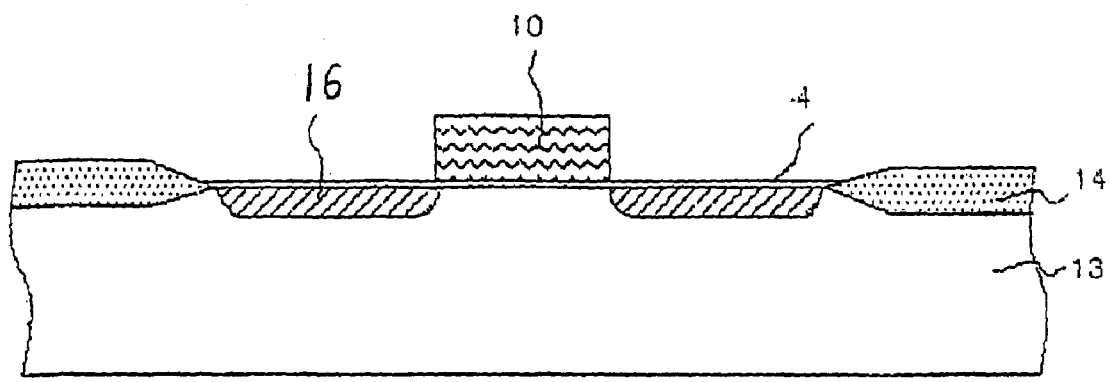
FIGS. 2A through 2D are fragmentary cross sectional elevation views of field effect transistors in sequential steps involved in a typical example of a conventional method of forming a gate-overlap-drain structure.
Figure 2B:
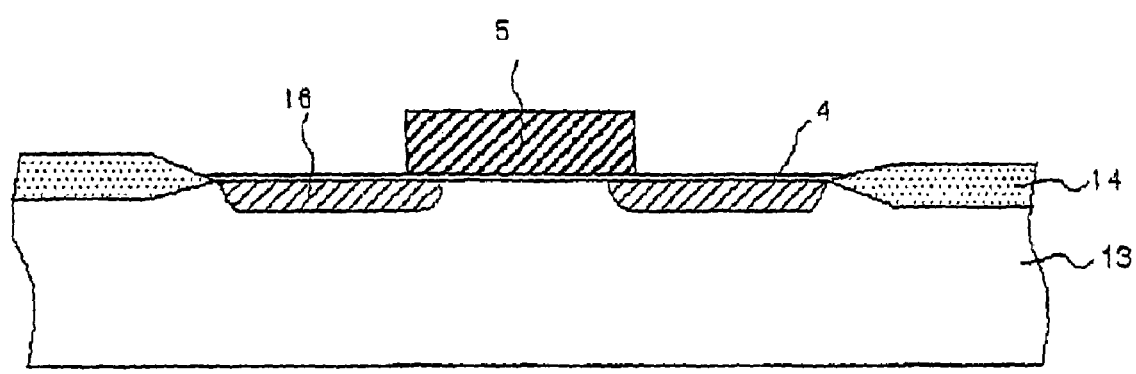
Figure 2C:
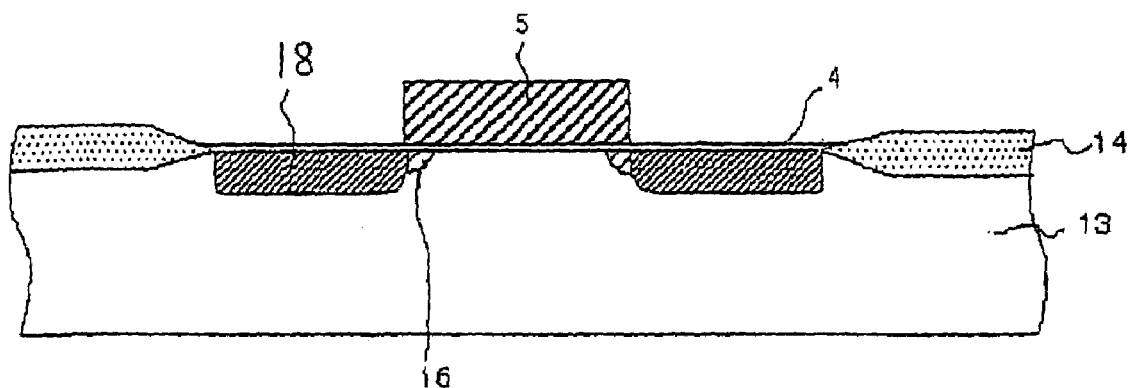
Figure 2D:
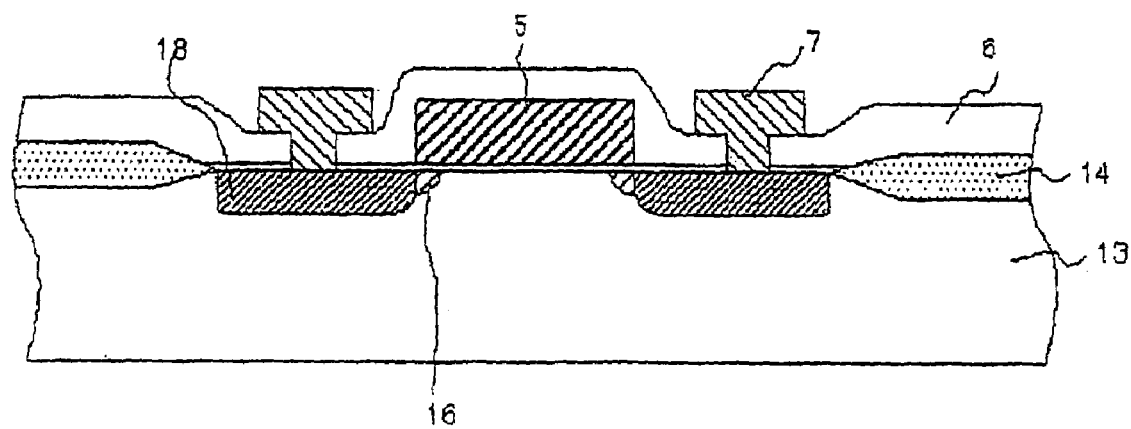
Figure 3A:
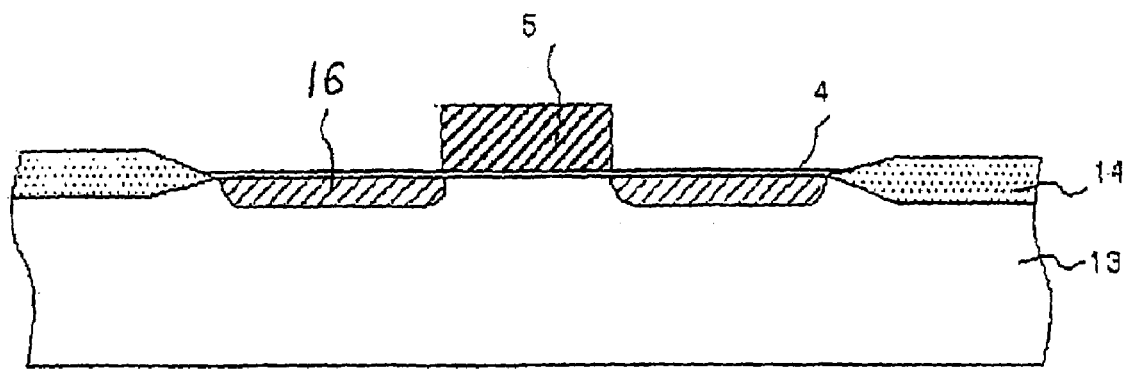
FIGS. 3A through 3D are fragmentary cross sectional elevation views of field effect transistors in sequential steps involved in another typical example of a conventional method of forming another gate-overlap-drain structure.
Figure 3B:
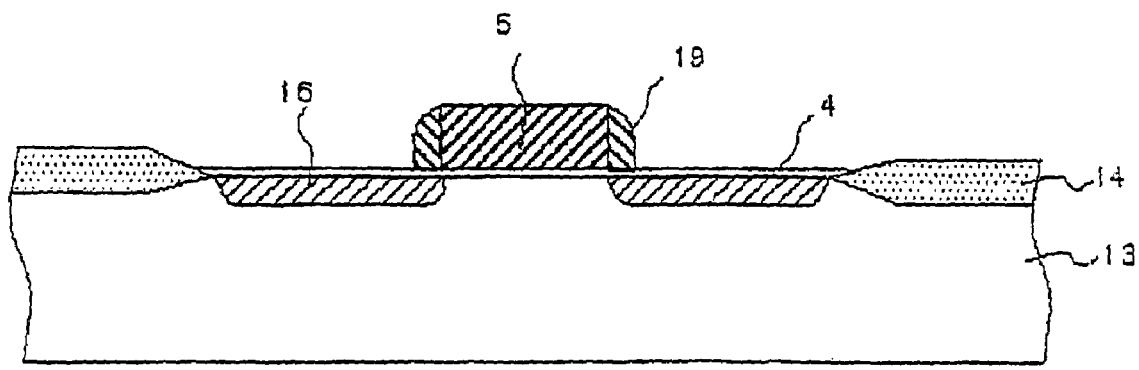
Figure 3C:
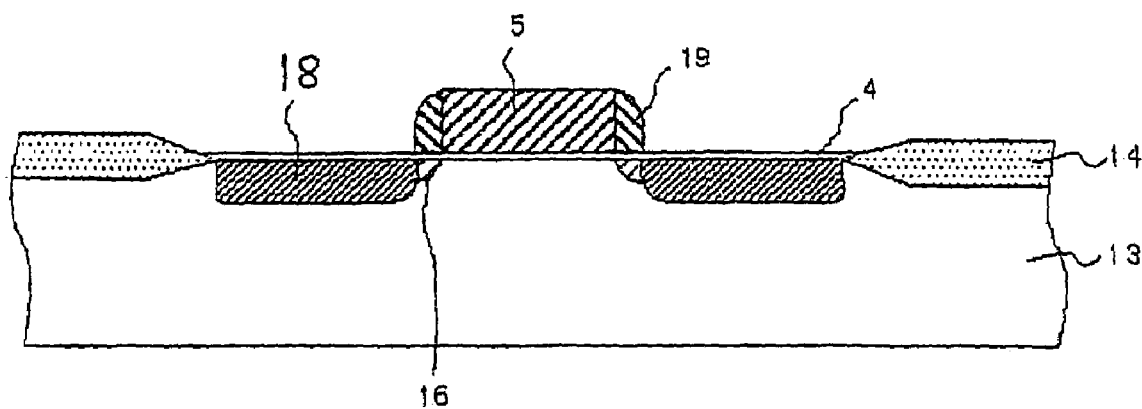
Figure 3D:
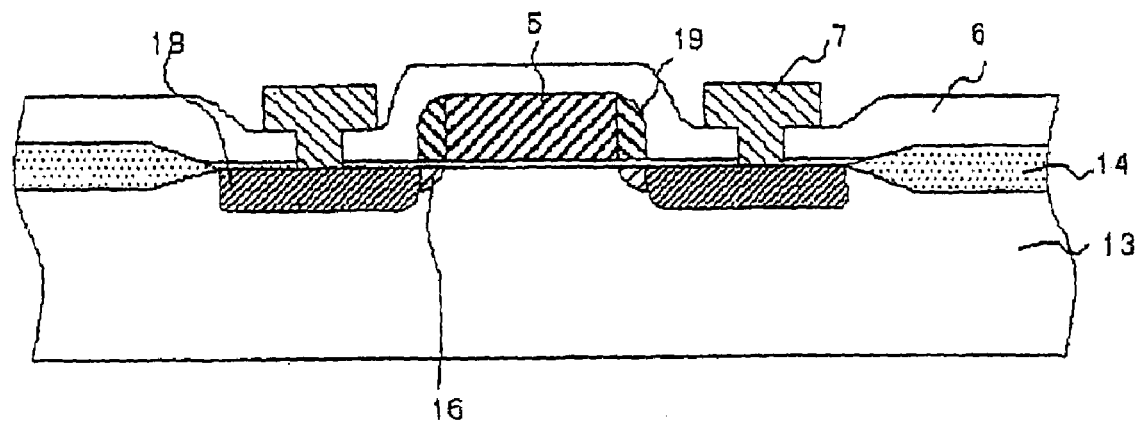
Figure 4:
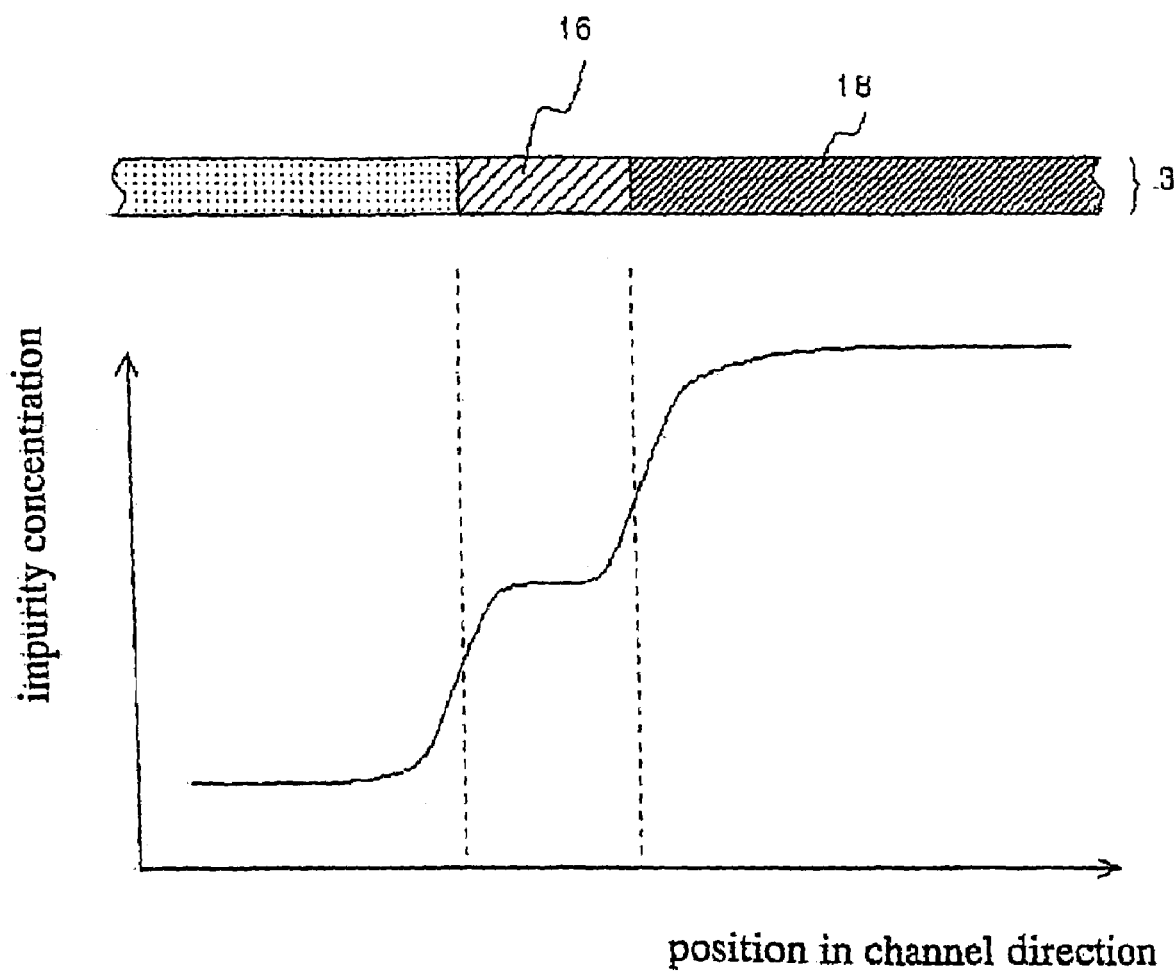
FIG. 4 is a diagram of an impurity concentration profile across the channel region, the low impurity concentration regions and the high impurity concentration regions of the field effect transistor having the gate-overlap drain structure.

A first aspect of the present invention is a semiconductor structure in a field effect transistor. The structure comprises: a semiconductor layer; an insulating layer overlying the semiconductor layer; and a gate electrode for controlling an electric field applied to at least a part of the semiconductor layer. The semiconductor layer further includes: at least a lightly activated high impurity concentration layer and at least a sufficiently activated high impurity concentration layer. The lightly activated high impurity concentration layer has a first implanted-impurity concentration value, and a first effectively-activated-impurity concentration range which is lower than the first implanted-impurity concentration value. The sufficiently activated high impurity concentration layer is bounded with the lightly activated high impurity concentration layer. The sufficiently activated high impurity concentration layer has a second implanted-impurity concentration value which is substantially the same as the first implanted-impurity concentration value, and a second effectively-activated-impurity concentration value which is higher than the first effectively-activated-impurity concentration range.

It is also preferable that the lightly activated high impurity concentration layer is positioned under the gate electrode. Further, preferably, a boundary between the lightly activated high impurity concentration layer and the sufficiently activated high impurity concentration layer is aligned to an edge of the gate electrode.

Furthermore, it is preferable that the lightly activated high impurity concentration layer has a gentle decrease in a first effectively-activated-impurity concentration value ranged in the first effectively-activated-impurity concentration range as a distance from the sufficiently activated high impurity concentration layer is increased.

It is further preferable that the sufficiently activated high impurity concentration layer is sufficiently activated by a laser beam irradiation, while the lightly activated high impurity concentration layer is insufficiently activated by a thermal diffusion from the sufficiently activated high impurity concentration layer.

It is also preferable that the sufficiently activated high impurity concentration layer serves as a drain region, while the lightly activated high impurity concentration layer serves as a field concentration relaxation region.

As a typical example, it is possible that the semiconductor layer comprises: a channel region; the lightly activated high impurity concentration layers adjacent to opposite sides of the channel region; and the sufficiently activated high impurity concentration layers adjacent to opposite outsides of the lightly activated high impurity concentration layers. The sufficiently activated high impurity concentration layers serve as source and drain regions. Respective boundaries between the lightly activated high impurity concentration layers and the sufficiently activated high impurity concentration layers are aligned to opposite side edges of the gate electrode.

A second aspect of the present invention is a semiconductor structure in a field effect transistor. The structure comprises: a semiconductor layer; an insulating layer overlying the semiconductor layer; and a gate electrode for controlling an electric field applied to at least a part of the semiconductor layer. The semiconductor layer further includes: at least a sufficiently activated high impurity concentration layer and at least a lightly activated high impurity concentration layer. The sufficiently activated high impurity concentration layer is sufficiently activated by a laser beam irradiation. The lightly activated high impurity concentration layer is bounded with the sufficiently activated high impurity concentration layer. The lightly activated high impurity concentration layer is insufficiently activated by a thermal diffusion from the sufficiently activated high impurity concentration layer.

It is preferable that the lightly activated high impurity concentration layer is positioned under the gate electrode. It is further preferable that a boundary between the lightly activated high impurity concentration layer and the sufficiently activated high impurity concentration layer is aligned to an edge of the gate electrode. It is furthermore preferable that the lightly activated high impurity concentration layer has a gentle decrease in a first effectively-activated-impurity concentration value as a distance from the sufficiently activated high impurity concentration layer is increased. It is moreover preferable that the lightly activated high impurity concentration layer has a first implanted-impurity concentration value, and a first effectively-activated-impurity concentration range which is lower than the first implanted-impurity concentration value, and that the sufficiently activated high impurity concentration layer has a second implanted-impurity concentration value which is substantially the same as the first implanted-impurity concentration value, and a second effectively-activated-impurity concentration value which is higher than the first effectively-activated-impurity concentration range.

It is also preferable that the sufficiently activated high impurity concentration layer serves as a drain region, while the lightly activated high impurity concentration layer serves as a field concentration relaxation region.

As a typical example, it is possible that the semiconductor layer comprises: a channel region; the lightly activated high impurity concentration layers adjacent to opposite sides of the channel region; and the sufficiently activated high impurity concentration layers adjacent to opposite outsides of the lightly activated high impurity concentration layers. The sufficiently activated high impurity concentration layers serve as source and drain regions. Respective boundaries between the lightly activated high impurity concentration layers and the sufficiently activated high impurity concentration layers are aligned to opposite side edges of the gate electrode.

A third aspect of the present invention is a field effect transistor including: a substrate; a gate insulating film over the substrate; a gate electrode over the gate insulating film; and source/drain regions over and substrate and under the gate insulating film. The drain region further includes: at least a lightly activated high impurity concentration lay and at least a sufficiently activated high impurity concentration layer. The lightly activated high impurity concentration layer has a first implanted-impurity concentration value, and a first effectively-activated-impurity concentration range which is lower than the first implanted-impurity concentration value. The sufficiently activated high impurity concentration layer is bounded with the lightly activated high impurity concentration layer. The sufficiently activated high impurity concentration layer has a second implanted-impurity concentration value which is substantially the same as the first implanted-impurity concentration value, and a second effectively-activated-impurity concentration value which is higher than the first effectively-activated-impurity concentration range.

It is preferable that the lightly activated high impurity concentration layer is positioned under the gate electrode. It is further preferable that a boundary between the lightly activated high impurity concentration layer and the sufficiently activated high impurity concentration layer is aligned to an edge of the gate electrode. It is further more preferable that the lightly activated high impurity concentration layer has a gentle decrease in a first effectively-activated-impurity concentration value ranged in the first effectively-activated-impurity concentration range as a distance from the sufficiently activated high impurity concentration layer is increased. It is moreover preferable that the sufficiently activated high impurity concentration layer is sufficiently activated by a laser beam irradiation, while the lightly activated high impurity concentration layer is insufficiently activated by a thermal diffusion from the sufficiently activated high impurity concentration layer.

It is also preferable that the source region has the same structure as the drain region.

A fourth aspect of the present invention is a field effect transistor including: a substrate; a gate insulating film over the substrate; a gate electrode over the gate insulating film; and source/drain regions over and substrate and under the gate insulating film. The drain region further includes: at least a sufficiently activated high impurity concentration layer and at least a lightly activated high impurity concentration layer. The sufficiently activated high impurity concentration layer is sufficiently activated by a laser beam irradiation. The lightly activated high impurity concentration layer is bounded with the sufficiently activated high impurity concentration layer. The lightly activated high impurity concentration layer is insufficiently activated by a thermal diffusion from the sufficiently activated high impurity concentration layer.

It is preferable that the lightly activated high impurity concentration layer is positioned under the gate electrode. It is further preferable that a boundary between the lightly activated high impurity concentration layer and the sufficiently activated high impurity concentration layer is aligned to an edge of the gate electrode. It is further more preferable that the lightly activated high impurity concentration layer has a gentle decrease in a first effectively-activated-impurity concentration value as a distance from the sufficiently activated high impurity concentration layer is increased. It is moreover preferable that the lightly activated high impurity concentration layer has a first implanted-impurity concentration value, and a first effectively-activated-impurity concentration range which is lower than the first implanted-impurity concentration value; and that the sufficiently activated high impurity concentration layer has a second implanted-impurity concentration value which is substantially the same as the first implanted-impurity concentration value, and a second effectively-activated-impurity concentration value which is higher than the first effectively-activated-impurity concentration range.

It is also preferable that the source region has the same structure as the drain region.

A fifth aspect of the present invention is a field effect transistor including: a substrate; a gate insulating film over the substrate; a gate electrode over the gate insulating film; and source/drain regions over and substrate and under the gate insulating film. Each of the source/drain regions further includes: at least a lightly activated high impurity concentration layer and at least a sufficiently activated high impurity concentration layer. The lightly activated high impurity concentration layer is positioned under the gate electrode. The lightly activated high impurity concentration layer has a first implanted-impurity concentration value, and a first effectively-activated-impurity concentration range which is lower than the first implanted-impurity concentration value. The sufficiently activated high impurity concentration layer is bounded with the lightly activated high impurity concentration layer. A boundary between the lightly activated high impurity concentration layer and the sufficiently activated high impurity concentration layer is aligned to an edge of the gate electrode. The sufficiently activated high impurity concentration layer has a second implanted-impurity concentration value which is substantially the same as the first implanted-impurity concentration value, and a second effectively-activated-impurity concentration value which is higher than the first effectively-activated-impurity concentration range. The lightly activated high impurity concentration layer has a gentle decrease in a first effectively-activated-impurity concentration value ranged in the first effectively-activated-impurity concentration range as a distance from the sufficiently activated high impurity concentration layer is increased.

It is preferable that the sufficiently activated high impurity concentration layer is sufficiently activated by a laser beam irradiation, while the lightly activated high impurity concentration layer is insufficiently activated by a thermal diffusion from the sufficiently activated high impurity concentration layer.

It is also preferable that the field effect transistor is a thin film field effect transistor.

A sixth aspect of the present invention is a liquid crystal display including a plurality of pixels, each pixel having a liquid crystal cell and a switching device. The switching device further comprises: a thin film field effect transistor including: a substrate; a gate insulating film over the substrate; a gate electrode over the gate insulating film; and source/drain regions over and substrate and under the gate insulating film. Each of the source/drain regions further includes: at least a lightly activated high impurity concentration layer and at least a sufficiently activated high impurity concentration layer. The lightly activated high impurity concentration layer is positioned under the gate electrode. The lightly activated high impurity concentration layer has a first implanted-impurity concentration value, and a first effectively-activated-impurity concentration range which is lower than the first implanted-impurity concentration value. The sufficiently activated high impurity concentration layer is bounded with the lightly activated high impurity concentration layer. A boundary between the lightly activated high impurity concentration layer and the sufficiently activated high impurity concentration layer is aligned to an edge of the gate electrode. The sufficiently activated high impurity concentration layer has a second implanted-impurity concentration value which is substantially the same as the first implanted-impurity concentration value, and a second effectively-activated-impurity concentration value which is higher than the first effectively-activated-impurity concentration range. The lightly activated high impurity concentration layer has a gentle decrease in a first effectively-activated-impurity concentration value ranged in the first effectively-activated-impurity concentration range as a distance from the sufficiently activated high impurity concentration layer is increased.

A seventh aspect of the present invention is a method of forming a semiconductor structure in a field effect transistor. The method comprises the following steps. A resist pattern is selectively formed over a first selected region of a semiconductor layer. A selective impurity-implantation is then carried out by use of the resist pattern as a mask for selectively implanting an impurity into the semiconductor layer except under the resist pattern at a first implanted-impurity concentration, to define at least an impurity-implanted region in the semiconductor layer. The resist pattern is then removed from the semiconductor layer. A gate electrode is selectively formed over a second selected region of the semiconductor layer. The second selected region completely encompasses the first selected region and also encompasses an outside region adjacent to a periphery of the first selected region. At least a gate-overlapped part of then impurity-implanted region is covered by the gate electrode, while a remaining non-overlapped part of then impurity-implanted region is not covered by the gate electrode. A selective laser beam irradiation to the remaining non-overlapped part is carried out by use of the gate electrode as a mask. The remaining non-overlapped part is sufficiently activated upon the selective laser beam irradiation. The remaining non-overlapped part becomes at least a sufficiently activated high impurity concentration layer. The gate-overlapped part is insufficiently activated by a thermal diffusion from the remaining non-overlapped part. The gate-overlapped part becomes at least a lightly activated high impurity concentration layer.

It is preferable that the lightly activated high impurity concentration layer has a first implanted-impurity concentration value, and a first effectively-activated-impurity concentration range which is lower than the first implanted-impurity concentration value; and that the sufficiently activated high impurity concentration layer is bounded with the lightly activated high impurity concentration layer, and the sufficiently activated high impurity concentration layer has a second implanted-impurity concentration value which is substantially the same as the first implanted-impurity concentration value, and a second effectively-activated-impurity concentration value which is higher than the first effectively-activated-impurity concentration range.

It is further preferable that a boundary between the lightly activated high impurity concentration layer and the sufficiently activated high impurity concentration layer is aligned to an edge of the gate electrode. It is further more preferable that the lightly activated high impurity concentration layer has a gentle decrease in a first effectively-activated-impurity concentration value ranged in the first effectively-activated-impurity concentration range as a distance from the sufficiently activated high impurity concentration layer is increased.

As a typical example, it is possible that a dummy layer is additionally formed over at least an entirety of the semiconductor layer before selectively forming a resist pattern over the dummy layer for selectively implanting the impurity through the dummy layer into the semiconductor layer in the selective impurity implantation. The dummy layer may be removed in addition to the removal of the resist pattern before a gate insulating film is formed prior to the step of selectively forming the gate electrode over the gate insulating film.

The dummy layer may remain as the gate insulating film, so that the gate electrode is selectively formed over the dummy layer as the gate insulating film.

An eighth aspect of the present invention is a method of forming a semiconductor structure in a field effect transistor, comprising the following steps. A selective impurity-implantation is carried out for selectively implanting an impurity into a semiconductor layer, to define at least an impurity-implanted region in the semiconductor layer. A selective laser beam irradiation to at least a selected part of then impurity-implanted region is then carried out, whereby the selected part of then impurity-implanted region is sufficiently activated upon the selective laser beam irradiation, and the selected part becomes at least a sufficiently activated high impurity concentration layer. On the other hand, a remaining non-selected part of then impurity-implanted region is insufficiently activated by a thermal diffusion from the selected part, and the remaining non-selected part becomes at least a lightly activated high impurity concentration layer.

It is preferable that the lightly activated high impurity concentration layer has a first implanted-impurity concentration value, and a first effectively-activated-impurity concentration range which is lower than the first implanted-impurity concentration value, and also that the sufficiently activated high impurity concentration layer is bounded with the lightly activated high impurity concentration layer, and the sufficiently activated high impurity concentration layer has a second implanted-impurity concentration value which is substantially the same as the first implanted-impurity concentration value, and a second effectively-activated-impurity concentration value which is higher than the first effectively-activated-impurity concentration range.

It is further preferable that a boundary between the lightly activated high impurity concentration layer and the sufficiently activated high impurity concentration layer is aligned to an edge of the gate electrode. It is further more preferable that the lightly activated high impurity concentration layer has a gentle decrease in a first effectively-activated-impurity concentration value ranged in the first effectively-activated-impurity concentration range as a distance from the sufficiently activated high impurity concentration layer is increased.

In accordance with the present invention, the above-described improved gate-overlap-drain structure is obtained by a single pair of a single impurity implantation process and a single laser anneal process, wherein the improved gate-overlap-drain structure includes lightly activated high impurity concentration regions exhibiting substantially the same function as the lightly doped drain regions, wherein the lightly activated high impurity concentration regions are bounded with high impurity concentration regions serving as source and drain regions. The boundaries are self-aligned to edges of a gate electrode. Side regions of the gate electrode overlap the lightly activated high impurity concentration regions.

As described above, in accordance with the conventional gate-overlap-drain structure, the lightly doped drain regions are positioned under the side regions of the gate electrode to suppress hot carrier traps in the vicinity of the drain region and also to reduce the light leakage. The conventional gate-overlap-drain structure is, however, disadvantage in the necessary complicated manufacturing process.

In the meantime, the manufacturing processes for the field effect transistors may generally include heat treatments such as activation anneals for activating the implanted impurity and silicidation anneals for causing silicidation reactions to form silicide layers over the source and drain regions. Those anneals may include, but not limited to, a furnace anneal using an electric furnace, a rapid thermal anneal using an infrared ray lamp, and a laser anneal using a laser beam.

For example, an excited-dimer laser may be used for the activation anneal. The excited-dimer laser is a pulse laser having a short width of one-shot-pulse, for which reason a laser energy is likely to be absorbed in a relatively shallow region. This means it easy to control a depth of the activation region. Therefore, the excited-dimer laser anneal is suitable for activation of the low impurity concentration region of the lightly doped drain structure. In general, the purpose of the activation anneal is to cause a complete activation of the implanted impurity into the laser-irradiated region. The present inventor, however, proposed for utilizing a phenomenon that there is a difference in degree of activation between a laser-irradiated region having received a laser irradiation and a heat-diffused region having received a thermal diffusion from the laser irradiation, but not received the laser irradiation.

The furnace anneal and the rapid thermal anneal cause non-localized and non-selected heat supply to the entirety of the substrate, for which reason those anneals are incapable of controlling the degree of the activation of the implanted impurity for respective regions. In contrast, the laser anneal is advantageous in that the laser energy is absorbed in the relatively shallow region, and also the thermal diffusion is limited within a relatively narrow region. This allows a highly localized control of the degree of activation of the implanted impurity. After a selective ion-implantation is carried out to form a high impurity concentration region, then a selective laser beam irradiation is carried out to a selected region of the high impurity concentration region for causing complete activation of the impurity in the laser-irradiated region of the high impurity concentration region, while causing incomplete activation of the impurity in the remaining heat-diffused region free from the laser irradiation in the high impurity concentration region. The completely or heavily activated region of the high impurity concentration region serve as the source/drain regions, while the incompletely or lightly activated region of the high impurity concentration region serve as the lightly doped drain regions.

The lightly activated region has the same high impurity concentration as the source and drain regions, for which reason the lightly activated region is distinctly different from the lightly doped drain region which has a lower impurity concentration than the source and drain regions. The lightly activated high impurity concentration region, however, has a low concentration of effectively activated impurity which contributes to electrical conductivity because of the incomplete or light activation. Namely, only part of the actually implanted impurity is effectively activated and serves as effective carrier, while the remaining part of the actually implanted impurity does not serve as the carrier. For this reason, the lightly activated high impurity concentration region may exhibit substantially the same function as the lightly doped drain region.

The following embodiments are typical examples for practicing the foregoing aspects of the present invention. Although the subject matters of the present invention have been described in details, the following additional descriptions in one or more typical preferred embodiments or examples will be made with reference to the drawings for making it easy to understand the typical modes for practicing the foregoing aspects of the present invention.

Figure 5:
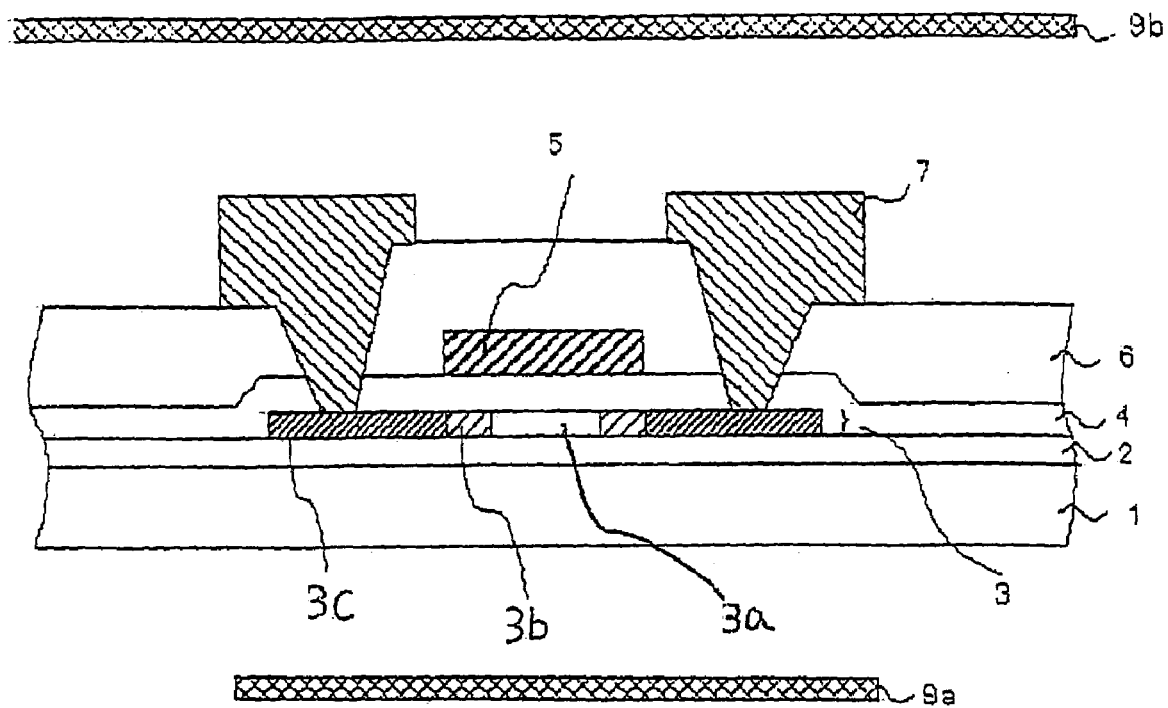
FIG. 5 is a fragmentary cross sectional elevation view of a novel thin film field effect transistor with an improved gate-overlap-drain structure in accordance with the first embodiment of the present invention.

First Embodiment:

A first embodiment according to the present invention will be described in detail with reference to the drawings. FIG. 5 is a fragmentary cross sectional elevation view of a novel thin film field effect transistor with an improved gate-overlap-drain structure in accordance with the first embodiment of the present invention.

A thin film field effect transistor is provided over a glass substrate 1. An under-coat layer 2 overlies the glass substrate 1. A semiconductor layer 3 is selectively provided over the under-coat layer 2. Typically, the semiconductor layer 3 may be made of polysilicon. The semiconductor layer 3 further comprises a channel layer 3a, lightly activated high impurity concentration layers 3b in contact directly with opposite sides of the channel layer 3a, and sufficiently activated high impurity concentration layers 3c in contact directly with outsides of the lightly activated high impurity concentration layers 3b. A gate insulating film 4 extends over the semiconductor layer 3 and the under-coat layer 2.

A gate electrode 5 is selectively provided over the gate insulating film 4. The lightly activated high impurity concentration layers 3b are positioned under the gate electrode 5, so that the lightly activated high impurity concentration layers 3b are covered by the gate electrode 5. The sufficiently activated high impurity concentration layers 3c are positioned under outsides of the gate electrode 5, so that the sufficiently activated high impurity concentration layers 3c are not covered by the gate electrode 5. Respective boundaries between the sufficiently activated high impurity concentration layers 3c and the lightly activated high impurity concentration layers 3b are self-aligned to the opposite side-edges of the gate electrode 5.

An inter-layer insulator 6 extends over the gate electrode 5 and the gate insulating film 4. Contact holes are provided in laminations of the gate insulating film 4 and the inter-layer insulator 6 but over the sufficiently activated high impurity concentration layers 3c. Source/drain electrodes 7 are selectively provided in the contact holes and over the inter-layer insulator 6, so that the source/drain electrodes 7 are in contact with the sufficiently activated high impurity concentration layers 3c. The sufficiently activated high impurity concentration layers 3c serve as source/drain regions.

In addition, the transistor has a pair of top and bottom light shielding layers 9b and 9a, wherein the top light shielding layer 9b overlies the transistor, while the bottom light shielding layer 9a underlies the glass substrate 1 of the transistor.

The lightly activated high impurity concentration layers 3b and the sufficiently activated high impurity concentration layers 3c have the same impurity concentration. The impurity implanted in the sufficiently activated high impurity concentration layers 3c are sufficiently activated by direct laser beam irradiation in the laser anneal process. The impurity implanted in the lightly activated high impurity concentration layers 3b are lightly or insufficiently activated by a thermal diffusion from the sufficiently activated high impurity concentration layers 3c. The lightly activated high impurity concentration layers 3b have not received any laser irradiation. Namely, the activation energy for the lightly activated high impurity concentration layers 3b depends on the thermal diffusion from the sufficiently activated high impurity concentration layers 3c, for which reason the activation is insufficient. This insufficient activation depending on the thermal diffusion gives rise to a lower concentration of the effectively activated impurity than the implanted-impurity concentration. The effectively activated impurity only may contribute to provide an electrical conductivity. For those reasons, the lightly activated high impurity concentration layers 3b exhibits substantially the same function as the lightly doped drain regions.

Further, the thermal diffusion into the lightly activated high impurity concentration layers 3b is directed inwardly from the sufficiently activated high impurity concentration layers 3c which have received the laser irradiation in the laser anneal process. For this reason, the heat energy absorbed into the lightly activated high impurity concentration layers 3b may gently or gradually decrease from the outside position near the sufficiently activated high impurity concentration layers 3c to the inside position far from the sufficiently activated high impurity concentration layers 3c. Therefore, the degree of the activation of the impurity may gently or gradually decrease from the outside position near the sufficiently activated high impurity concentration layers 3c to the inside position far from the sufficiently activated high impurity concentration layers 3c. Namely, the concentration profile of the effectively activated impurity may gently or gradually decrease from the outside position near the sufficiently activated high impurity concentration layers 3c to the inside position far from the sufficiently activated high impurity concentration layers 3c. Accordingly, the concentration profile of the effectively activated impurity across the channel region 3a, the lightly activated high impurity concentration layers 3b and the sufficiently activated high impurity concentration layers 3c are free of any step-like variation or any other abrupt and rapid variation, whereby no extensively high field concentration is caused.

FIGS. 6A through 6I are fragmentary cross sectional elevation views of thin film field effect transistors with the improved gate-overlap-drain structure in sequential steps involved in a novel method of forming the transistor in accordance with the first embodiment of the present invention.

Figure 6A:
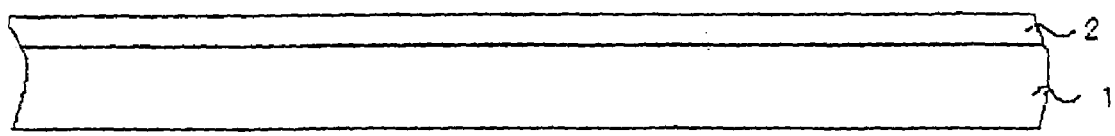
FIGS. 6A through 6I are fragmentary cross sectional elevation views of thin film field effect transistors with the improved gate-overlap-drain structure in sequential steps involved in a novel method of forming the transistor in accordance with the first embodiment of the present invention.

As shown in FIG. 6A, a transparent insulating substrate 1 such as a glass substrate 1 is prepared. An under-coat layer 2 is formed over the transparent insulating substrate 1. The under-coat layer 2 may typically have a thickness in the range of 100–500 nm and more preferably about 300 nm. The under-coat layer 2 is provided in order to prevent any further impurity diffusion from the substrate 1 to any overlying layers, for example, a semiconductor layer 3. The under-coat layer 2 is not necessarily needed if the above impurity diffusion is not problem. The under-coat layer 2 may be formed by one of any available methods such as a low pressure chemical vapor deposition method, a plasma enhanced chemical vapor deposition method, a sputtering method and a dipping method. The under-coat layer 2 may typically comprise, but not limited to, any one of a silicon oxide layer, a silicon nitride layer, and laminations thereof.

Figure 6B:
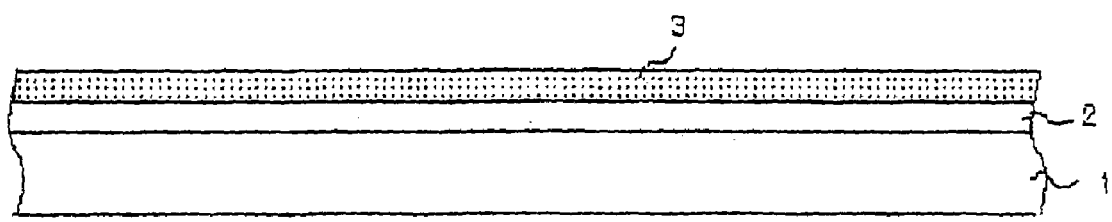

As shown in FIG. 6B, a polycrystal silicon layer 3 is formed over the under-coat layer 2. A typical example of forming the polycrystal silicon layer 3 is that an amorphous silicon layer as a precursor is first formed over the under-coat layer 2, before the amorphous silicon layer is then crystallized by a laser irradiation. The amorphous silicon layer may be formed by one of any available methods such as a low pressure chemical vapor deposition method, a plasma enhanced chemical vapor deposition method and a sputtering method. A typical thickness of the amorphous silicon layer may be in the range of 50–100 nm. Instead of the laser irradiation for crystallization, a solid-state growth method may also be available.

Figure 6C:
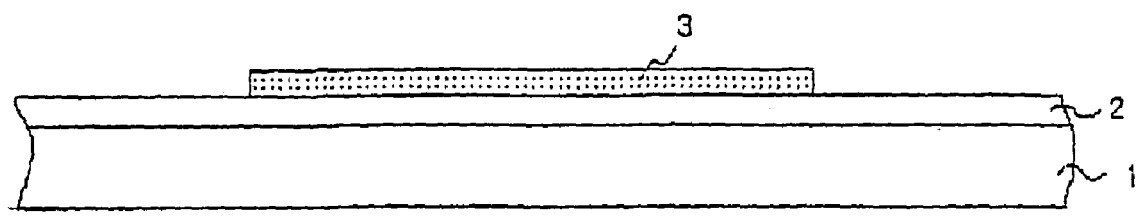

As shown in FIG. 6C, a resist pattern is selectively formed over the polycrystal silicon layer 3 by use of the known lithography technique. The polycrystal silicon layer 3 is then patterned into an island shape by an anisotropic etching technique using the resist pattern as a mask. The used resist pattern is then removed.

Figure 6D:
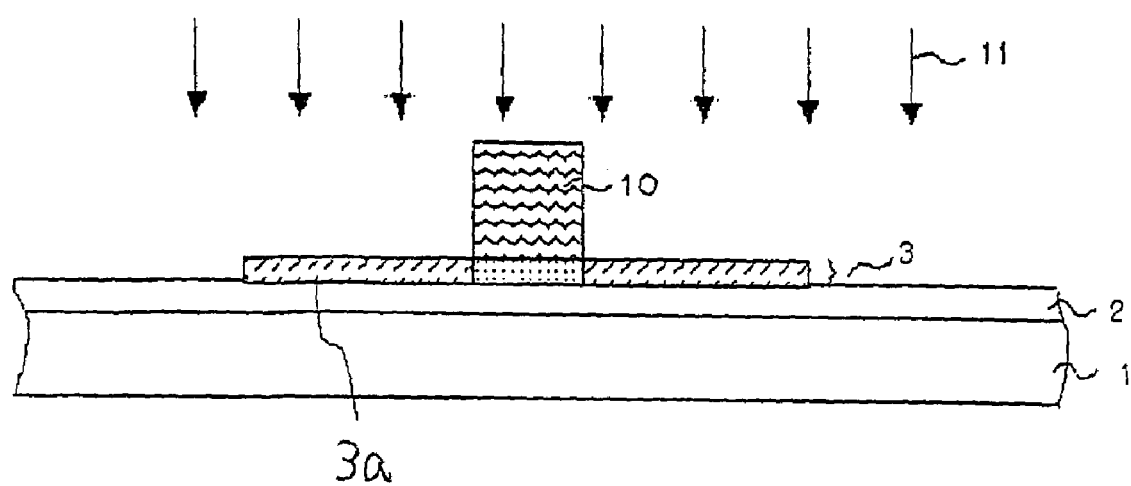

As shown in FIG. 6D, another resist pattern 10 is also selectively formed over the patterned polycrystal silicon layer 3. A selective impurity-implantation process is carried out by use of the resist pattern 10 as a mask, so that impurity ions 11 are selectively implanted into the patterned polycrystal silicon layer 3 except under the resist pattern 10, thereby to form high impurity concentration regions 3a in the patterned polycrystal silicon layer 3, except under the resist pattern 10. The impurity may, for example, be phosphorous but not limited thereto. A size of the resist pattern 10 is smaller than an intended gate electrode formation region by a size of lightly activated high impurity concentration layers. A typical example of the doping conditions is that an acceleration voltage is approximately 20 keV, and a dose is in the range of 8E14/cm2 through 3E15/cm2. Whereas the above typical example of the doping conditions has been shown, the acceleration voltage and the dose are not limited to the above value and range, but should rather be decided by taking into account the correlation to the laser anneal process to be described below. The used resist pattern 10 is then removed.

Figure 6E:
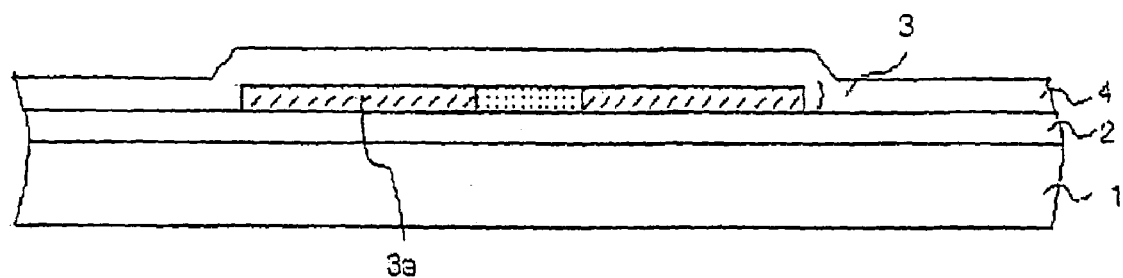

As shown in FIG. 6E, a gate insulating film 4 is then formed over the semiconductor layer 3 and the under-coat layer 2. The gate insulating film 4 may comprise any available insulating film including but not limited to silicon oxide and silicon nitride. The gate insulating film 4 may be formed by one of any available methods such as a low pressure chemical vapor deposition method, a plasma enhanced chemical vapor deposition method and a sputtering method. The thickness of the gate insulating film 4 may advantageously be decided by taking into account a driving condition of the device and a driving voltage. A typical example of the thickness of the gate insulating film 4 may be in the range of 30–200 nm, and preferably 50–100 nm.

Figure 6F:
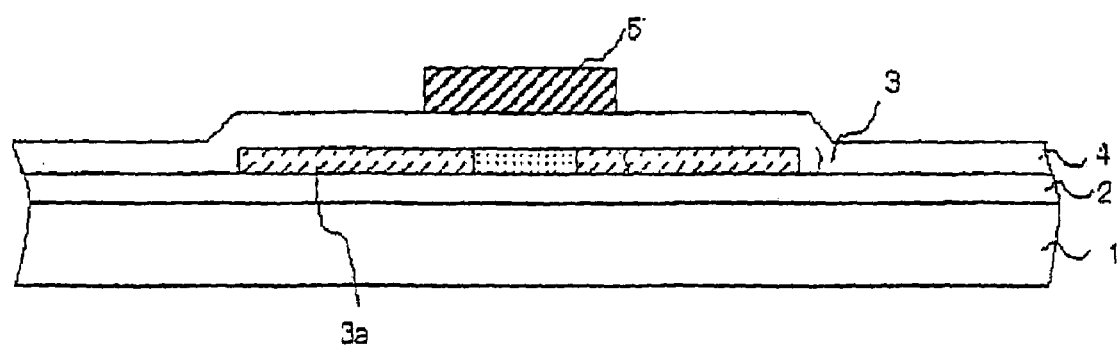

As shown in FIG. 6F, a conductive film is deposited over the gate insulating film 4. The conductive film may comprise any available conductive film, for example, a silicide film, a metal film, and an impurity-doped silicon film. The deposition may typically be made by a plasma enhanced chemical vapor deposition method. A typical example of the thickness of the conductive film may be in the range of 200–400 nm. A resist pattern is selectively formed over the conductive film by the know lithography technique. An anisotropic etching process is then carried out by use of the resist pattern as a mask to define the conductive film into a gate electrode 5. Since the resist pattern overlaps predetermined inside regions of the high impurity concentration regions 3a of the semiconductor layer 3, then the gate electrode 5 also overlaps predetermined inside regions of the high impurity concentration regions 3a of the semiconductor layer 3. In this typical example, the above overlap appears symmetrically both the source and drain sides, but it should be noted that the above overlap is needed at least in the drain side. Namely, it is possible that the above overlap appears only in the drain side, or also possible that the above overlap appears asymmetrically both in the source and drain sides. It should also be noted that if the transistor is for the switching transistor utilizing the inversion between the source and drain regions, then the above overlap should appear symmetrically in both the source and drain sides.

Figure 6G:
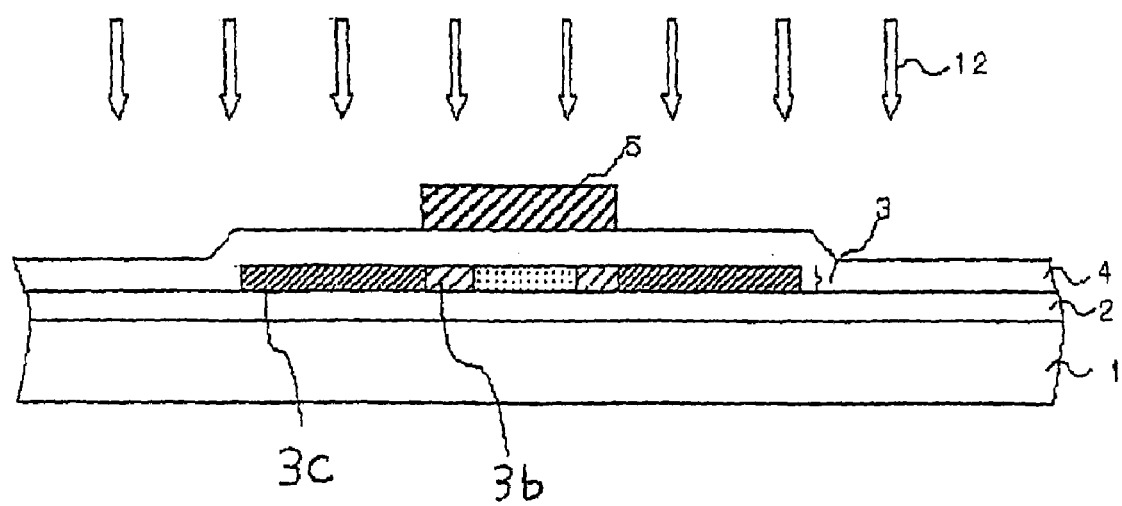

As shown in FIG. 6G, a selective laser irradiation process is then carried out by use of the gate electrode 5 as a mask, so that a laser beam 12 is irradiated through the gate insulating film 4 to the semiconductor layer 3, except under the gate electrode 5 for the purpose of selective activation of the semiconductor layer 3, except under the gate electrode 5. The non-overlapped regions of the semiconductor layer 3 do receive the laser beam irradiation, whereby the non-overlapped regions become sufficiently activated high impurity concentration layers 3c. The impurity in the non-overlapped regions or the sufficiently activated high impurity concentration layers 3c is sufficiently activated and the most of the impurity becomes effectively activated impurity which contributes to the electrical conductivity.

On the other hand, the gate-overlapped regions of the semiconductor layer 3 do not receive the laser beam irradiation but do receive a thermal diffusion from the non-overlapped regions, whereby the gate-overlapped regions become lightly activated high impurity concentration layers 3b. The impurity in the gate-overlapped regions or the lightly activated high impurity concentration layers 3b is insufficiently activated and the minority of the impurity becomes effectively activated impurity which contributes to the electrical conductivity. Namely, the lightly activated high impurity concentration layers 3b has a lower concentration of the effectively activated impurity, which contributes to the electrical conductivity, than the concentration of the implanted-impurity.

Namely, the lightly activated high impurity concentration layers 3b and the sufficiently activated high impurity concentration layers 3c have the same impurity concentration. The impurity implanted in the sufficiently activated high impurity concentration layers 3c are sufficiently activated by direct laser beam irradiation in the laser anneal process. The impurity implanted in the lightly activated high impurity concentration layers 3b are lightly or insufficiently activated by a thermal diffusion from the sufficiently activated high impurity concentration layers 3c. The lightly activated high impurity concentration layers 3b have not received any laser irradiation. Namely, the activation energy for the lightly activated high impurity concentration layers 3b depends on the thermal diffusion from the sufficiently activated high impurity concentration layers 3c, for which reason the activation is insufficient. This insufficient activation depending on the thermal diffusion gives rise to a lower concentration of the effectively activated impurity than the implanted-impurity concentration. The effectively activated impurity only may contribute to provide an electrical conductivity. For those reasons, the lightly activated high impurity concentration layers 3b exhibits substantially the same function as the lightly doped drain regions.

Further, the thermal diffusion into the lightly activated high impurity concentration layers 3b is directed inwardly from the sufficiently activated high impurity concentration layers 3c which have received the laser irradiation in the laser anneal process. For this reason, the heat energy absorbed into the lightly activated high impurity concentration layers 3b may gently or gradually decrease from the outside position near the sufficiently activated high impurity concentration layers 3c to the inside position far from the sufficiently activated high impurity concentration layers 3c. Therefore, the degree of the activation of the impurity may gently or gradually decrease from the outside position near the sufficiently activated high impurity concentration layers 3c to the inside position far from the sufficiently activated high impurity concentration layers 3c. Namely, the concentration profile of the effectively activated impurity may gently or gradually decrease from the outside position near the sufficiently activated high impurity concentration layers 3c to the inside position far from the sufficiently activated high impurity concentration layers 3c.

Accordingly, the concentration profile of the effectively activated impurity across the channel region free of impurity implantation, the lightly activated high impurity concentration layers 3b and the sufficiently activated high impurity concentration layers 3c are free of any step-like variation or any other abrupt and rapid variation, whereby no extensively high field concentration is caused.

The energy of the laser irradiation may be decided by taking into account respective thicknesses of the semiconductor layer 3 and the gate insulating film 4 as well as respective surface reflectivities thereof, and also with reference to an energy which causes semiconductor or silicon of the semiconductor layer 3 to be melt. A typical example of the laser irradiation energy may be in the range of 250–300 mJ, but not limited thereto.

Figure 6H:
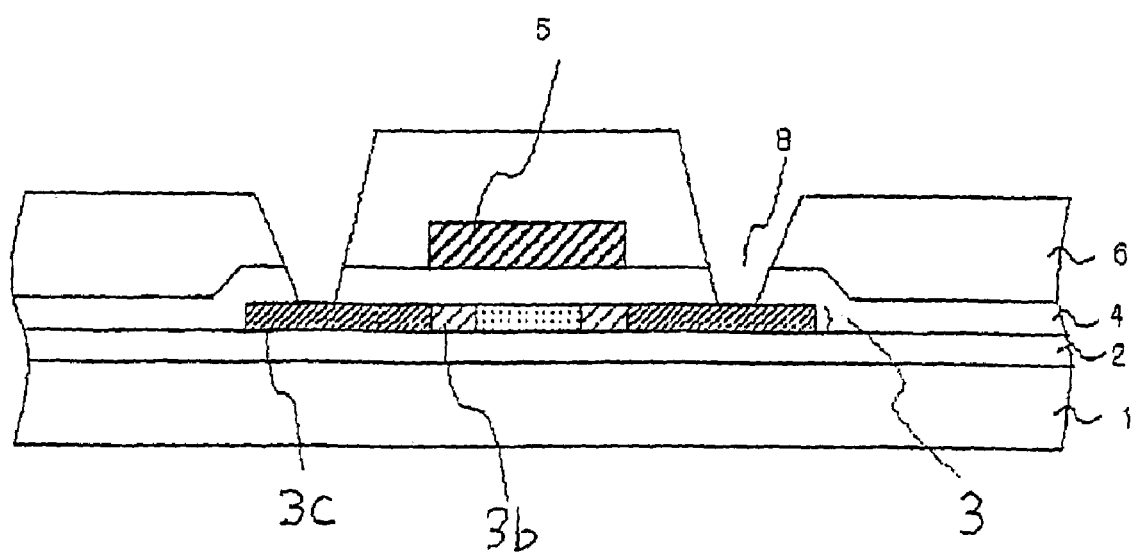

As shown in FIG. 6H, an inter-layer insulator 6 is deposited over the gate electrode 5 and the gate insulating film 4. Contact holes 8 are selectively formed in the inter-layer insulator 6 and the gate insulating film 4 and over the sufficiently activated high impurity concentration layers 3c serving as source and drain regions.

Figure 6I:
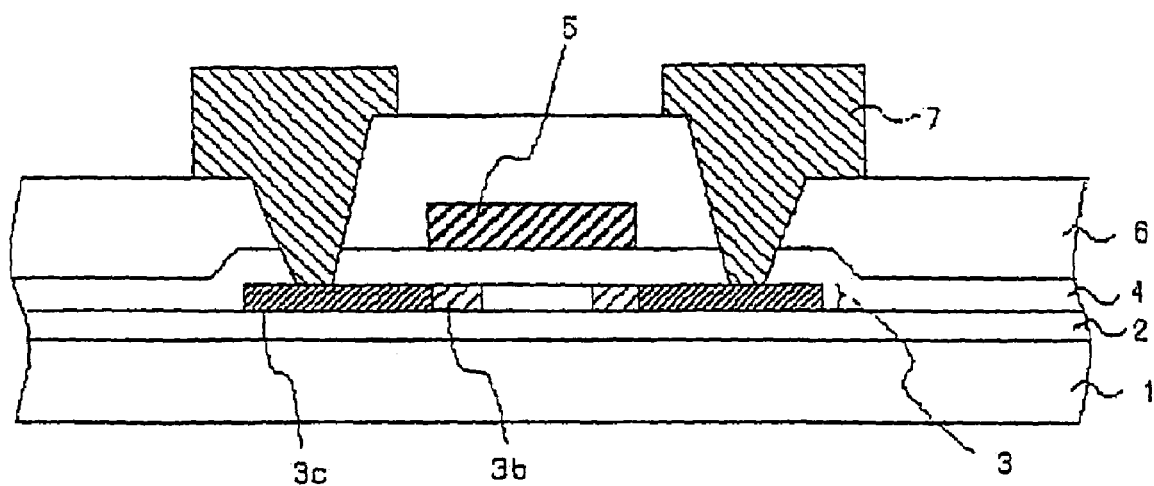

As shown in FIG. 6I, a metal film is also deposited over the inter-layer insulator 6 and within the contact holes 8, so that the metal film is made into contact with the sufficiently activated high impurity concentration layers 3c. The deposition may be made by any available method, for example, a sputtering method. A typical example of the thickness of the metal film may be in the range of 300–1000 nm, but not limited thereto. A typical example of material for the metal film may be aluminum, but not limited thereto. The metal film is then patterned into source and drain electrodes 7 by use of a known lithography technique and a subsequent anisotropic etching process, thereby forming the thin film field effect transistor including the improved gate-overlap-drain structure.

As described above, the above novel method for forming the improved gate-overlap-drain structure utilizes a single pair of the above-described single impurity implantation process and the above-described single laser anneal process. The improved gate-overlap-drain structure includes the lightly activated high impurity concentration regions 3b exhibiting substantially the same function as the lightly doped drain regions. The lightly activated high impurity concentration regions 3b are bounded with the sufficiently activated high impurity concentration layers 3c serving as source and drain regions. The boundaries are self-aligned to opposite side edges of the gate electrode 5. Side regions of the gate electrode 5 overlap the lightly activated high impurity concentration regions 3b.

After the above-described selective ion-implantation is carried out to form a high impurity concentration region 3a, then the above-described selective laser beam irradiation is carried out to the non-overlapped regions of the high impurity concentration region 3a for causing sufficient activation of the impurity in the laser-irradiated regions 3c of the high impurity concentration region 3a, while causing in sufficient activation of the impurity in the remaining heat-diffused regions 3b free from the laser irradiation in the high impurity concentration region 3a. The completely or highly activated regions 3c of the high impurity concentration region 3a serve as the source/drain regions, while the incompletely or lightly activated regions 3b of the high impurity concentration region 3a serve as the lightly doped drain regions.

The lightly activated high impurity concentration layers 3b have the same high impurity concentration as the source and drain regions or the sufficiently activated high impurity concentration layers 3c, for which reason the lightly activated high impurity concentration layers 3b are distinctly different from the lightly doped drain region which has a lower impurity concentration than the source and drain regions. The lightly activated high impurity concentration layers 3b, however, have a low concentration of the effectively activated impurity which contributes to electrical conductivity because of the incomplete or light activation depending only upon the thermal diffusion from the sufficiently activated high impurity concentration layers 3c.

Figure 7:
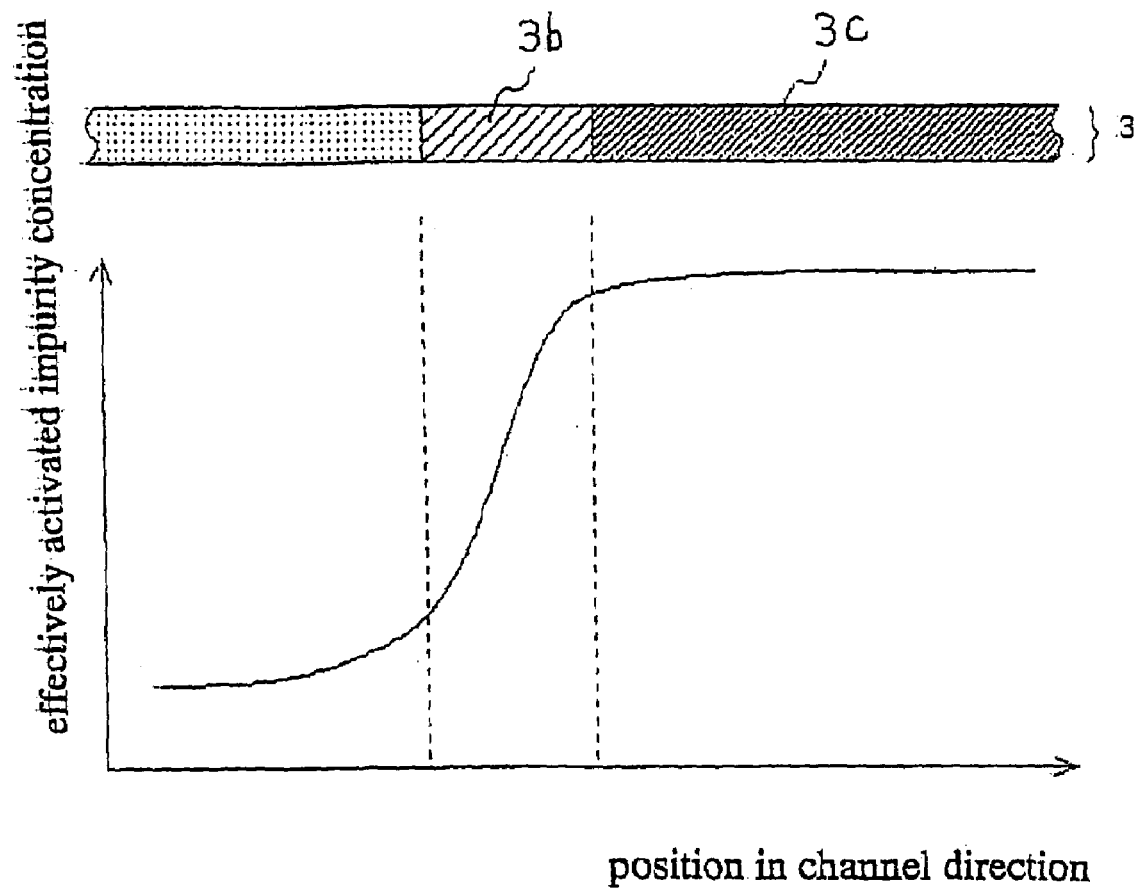
FIG. 7 is a diagram of an impurity concentration profile across the channel region, the lightly activated high impurity concentration layers and the sufficiently activated high impurity concentration layers of the field effect transistor having the improved gate-overlap drain structure shown in FIG. 5.

FIG. 7 is a diagram of an effectively activated impurity concentration profile across the channel region, the lightly activated high impurity concentration layers and the sufficiently activated high impurity concentration layers of the field effect transistor having the improved gate-overlap drain structure shown in FIG. 5. The thermal diffusion into the lightly activated high impurity concentration layers 3b is directed inwardly from the sufficiently activated high impurity concentration layers 3c which have received the laser irradiation in the laser anneal process. For this reason, the heat energy absorbed into the lightly activated high impurity concentration layers 3b may gently or gradually decrease from the outside position near the sufficiently activated high impurity concentration layers 3c to the inside position far from the sufficiently activated high impurity concentration layers 3c. Therefore, the degree of the activation of the impurity may gently or gradually decrease from the outside position near the sufficiently activated high impurity concentration layers 3c to the inside position far from the sufficiently activated high impurity concentration layers 3c. Namely, the concentration profile of the effectively activated impurity may gently or gradually decrease from the outside position near the sufficiently activated high impurity concentration layers 3c to the inside position far from the sufficiently activated high impurity concentration layers 3c.

Accordingly, as shown in FIG. 7, the concentration profile of the effectively activated impurity across the channel region 3a, the lightly activated high impurity concentration layers 3b and the sufficiently activated high impurity concentration layers 3c are free of any step-like variation or any other abrupt and rapid variation, whereby no extensively high field concentration is caused. Namely, the above-improved gate-overlap-drain structure provides a highly effective controllability to hot carriers and also allow a long carrier life-time due to no traps of the hot carriers.

The above-described thin film field effect transistor may be applicable to a variety of transistors, typically, for example, a switching transistor acting for ON-OFF of each pixel included in a display device such as an active matrix liquid crystal display. Further, the transistor may be applicable to a variety of display devices and semiconductor devices. As described above, in accordance with the improved gate-overlap-drain structure, the lightly activated high impurity concentration layers 3b are covered by the gate electrode 5. This structure prevents an incidence of light reflected by respective layers in an active matrix substrate of the display into the lightly activated high impurity concentration layers 3b. Namely, it is ensured to avoid the undesirable leakage of light or possible incidence of light into the lightly activated high impurity concentration layers 3b.

In accordance with the above-described typical example, the transistor is formed over the glass substrate as the transparent insulating substrate. The present invention is of course applicable to when the transistor is formed over a variety of substrate, for example, a semiconductor substrate such as a silicon substrate.

Figure 8:
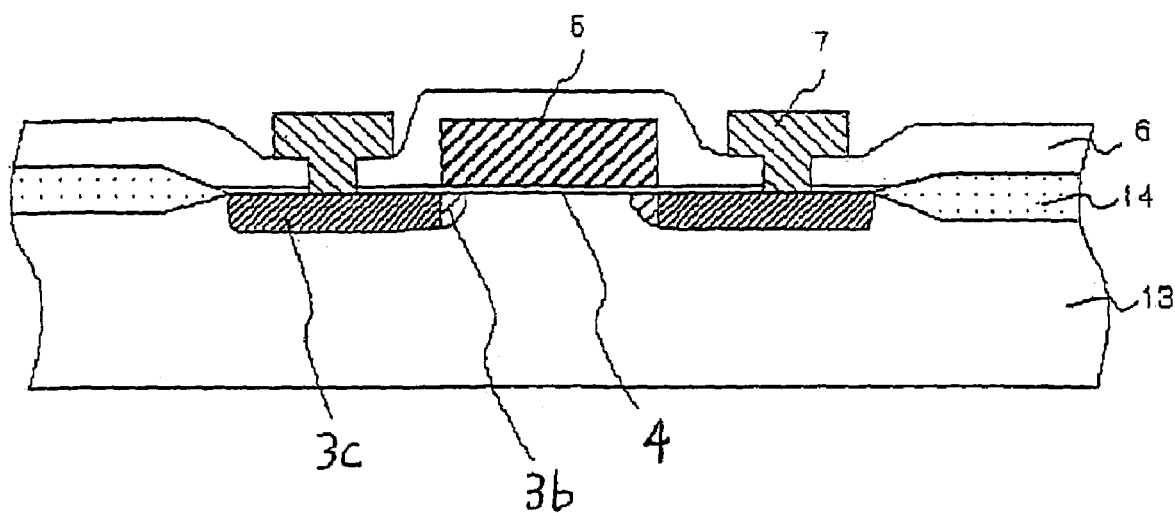
FIG. 8 is a fragmentary cross sectional elevation view of a novel thin film field effect transistor with an improved gate-overlap-drain structure in accordance with the second embodiment of the present invention.

Second Embodiment:

A second embodiment according to the present invention will be described in detail with reference to the drawings. FIG. 8 is a fragmentary cross sectional elevation view of a novel thin film field effect transistor with an improved gate-overlap-drain structure in accordance with the second embodiment of the present invention.

A thin film field effect transistor is provided over a silicon substrate 13. Isolation insulating films 14 are selectively provided over the silicon substrate 13 to define a field region of the silicon substrate 13. A gate insulating film 4 is provided over the field region of the silicon substrate 13. A gate electrode is selectively provided over the gate insulating film 4. Lightly activated high impurity concentration layers 3b are selectively provided in the silicon substrate 13, wherein the lightly activated high impurity concentration layers 3b are adjacent to opposite sides of a channel layer. Further, sufficiently activated high impurity concentration layers 3c are also selectively provided in the silicon substrate 13, wherein the sufficiently activated high impurity concentration layers 3c are adjacent to outsides of the lightly activated high impurity concentration layers 3b. The lightly activated high impurity concentration layers 3b are positioned under the gate electrode 5, so that the lightly activated high impurity concentration layers 3b are covered by the gate electrode 5. The sufficiently activated high impurity concentration layers 3c are positioned under outsides of the gate electrode 5, so that the sufficiently activated high impurity concentration layers 3c are not covered by the gate electrode 5. Respective boundaries between the sufficiently activated high impurity concentration layers 3c and the lightly activated high impurity concentration layers 3b are self-aligned to the opposite side-edges of the gate electrode 5.

An inter-layer insulator 6 extends over the gate electrode 5 and the gate insulating film 4. Contact holes are provided in laminations of the gate insulating film 4 and the inter-layer insulator 6 but over the sufficiently activated high impurity concentration layers 3c. Source/drain electrodes 7 are selectively provided in the contact holes and over the inter-layer insulator 6, so that the source/drain electrodes 7 are in contact with the sufficiently activated high impurity concentration layers 3c. The sufficiently activated high impurity concentration layers 3c serve as source/drain regions.

The lightly activated high impurity concentration layers 3b and the sufficiently activated high impurity concentration layers 3c have the same impurity concentration. The impurity implanted in the sufficiently activated high impurity concentration layers 3c are sufficiently activated by direct laser beam irradiation in the lease anneal process. The impurity implanted in the lightly activated high impurity concentration layers 3b are lightly or insufficiently activated by a thermal diffusion from the sufficiently activated high impurity concentration layers 3c. The lightly activated high impurity concentration layers 3b have not received any laser irradiation. Namely, the activation energy for the lightly activated high impurity concentration layers 3b depends on the thermal diffusion from the sufficiently activated high impurity concentration layers 3c, for which reason the activation is insufficient. This insufficient activation depending on the thermal diffusion gives rise to a lower concentration of the effectively activated impurity than the implanted-impurity concentration. The effectively activated impurity only may contribute to provide an electrical conductivity. For those reasons, the lightly activated high impurity concentration layers 3b exhibits substantially the same function as the lightly doped drain regions.

Further, the thermal diffusion into the lightly activated high impurity concentration layers 3b is directed inwardly from the sufficiently activated high impurity concentration layers 3c which have received the laser irradiation in the laser anneal process. For this reason, the heat energy absorbed into the lightly activated high impurity concentration layers 3b may gently or gradually decrease from the outside position near the sufficiently activated high impurity concentration layers 3c to the inside position far from the sufficiently activated high impurity concentration layers 3c. Therefore, the degree of the activation of the impurity may gently or gradually decrease from the outside position near the sufficiently activated high impurity concentration layers 3c to the inside position far from the sufficiently activated high impurity concentration layers 3c. Namely, the concentration profile of the effectively activated impurity may gently or gradually decrease from the outside position near the sufficiently activated high impurity concentration layers 3c to the inside position far from the sufficiently activated high impurity concentration layers 3c. Accordingly, the concentration profile of the effectively activated impurity across the channel region, the lightly activated high impurity concentration layers 3b and the sufficiently activated high impurity concentration layers 3c are free of any step-like variation or any other abrupt and rapid variation, whereby no extensively high field concentration is caused.

The above improved gate-overlap-drain structure may be formed by a single pair of a single impurity implantation process and a later single laser anneal process for selective activation. The impurity implantation process is carried out by using a resist pattern having a smaller size than the gate electrode 5 as a mask to form high impurity concentration regions which include both the lightly activated high impurity concentration layers 3b and the sufficiently activated high impurity concentration layers 3c. After the gate electrode 5 is formed, then the single laser anneal process is carried out by using the gate electrode as a mask for selective activation of the high impurity concentration regions, whereby the laser-irradiated regions non-overlapped and non-covered by the gate electrode 5 are sufficiently activated and become the sufficiently activated high impurity concentration layers 3c, while the laser-irradiation-free regions overlapped and covered by the gate electrode 5 are insufficiently activated by the thermal diffusion from the laser-irradiated regions and become the lightly activated high impurity concentration layers 3b.

Third Embodiment:

A third embodiment according to the present invention will be described in detail with reference to the drawings. This third embodiment is different from the first embodiment but only parts of the processes for forming the transistor, for which reason the following descriptions will focus on the sequential processes.

FIGS. 9A through 9I are fragmentary cross sectional elevation views of thin film field effect transistors with the improved gate-overlap-drain structure in sequential steps involved in a novel method of forming the transistor in accordance with the third embodiment of the present invention.

Figure 9A:
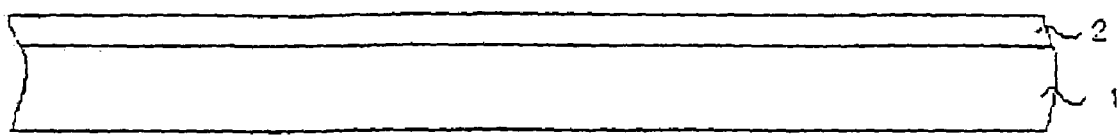
FIGS. 9A through 9I are fragmentary cross sectional elevation views of thin film field effect transistors with the improved gate-overlap-drain structure in sequential steps involved in a novel method of forming the transistor in accordance with the third embodiment of the present invention.

As shown in FIG. 9A, a transparent insulating substrate 1 such as a glass substrate 1 is prepared. An under-coat layer 2 is formed over the transparent insulating substrate 1. The under-coat layer 2 may typically have a thickness in the range of 100–500 nm and more preferably about 300 nm. The under-coat layer 2 is provided in order to prevent any further impurity diffusion from the substrate 1 to any overlying layers, for example, a semiconductor layer 3. The under-coat layer 2 is not necessarily needed if the above impurity diffusion is not problem. The under-coat layer 2 may be formed by one of any available methods such as a low pressure chemical vapor deposition method, a plasma enhanced chemical vapor deposition method, a sputtering method and a dipping method. The under-coat layer 2 may typically comprise, but not limited to, any one of a silicon oxide layer, a silicon nitride layer, and laminations thereof.

Figure 9B:
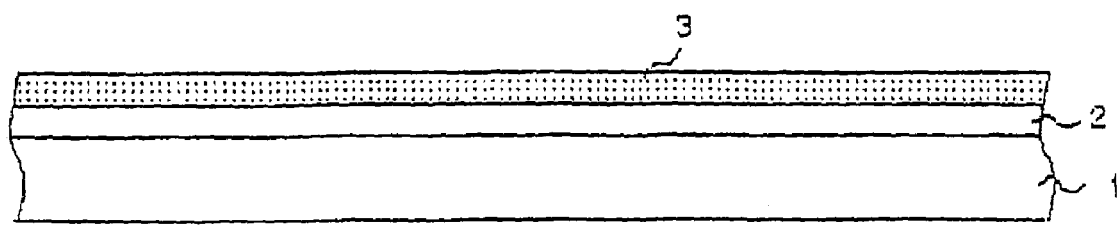

As shown in FIG. 9B, a polycrystal silicon layer 3 is formed over the under-coat layer 2. A typical example of forming the polycrystal silicon layer 3 is that an amorphous silicon layer as a precursor is first formed over the under-coat layer 2, before the amorphous silicon layer is then crystallized by a laser irradiation. The amorphous silicon layer may be formed by one of any available methods such as a low pressure chemical vapor deposition method, a plasma enhanced chemical vapor deposition method and a sputtering method. A typical thickness of the amorphous silicon layer may be in the range of 50–100 nm. Instead of the laser irradiation for crystallization, a solid-state growth method may also be available.

Figure 9C:
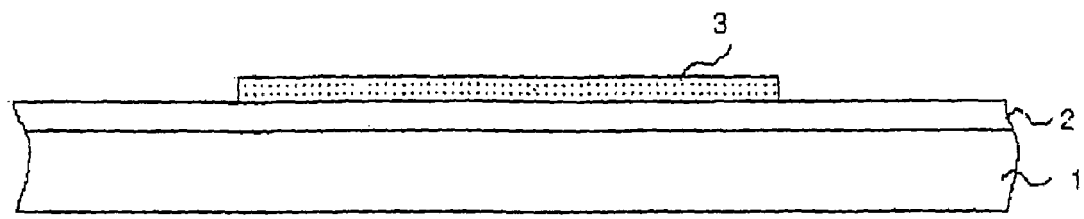

As shown in FIG. 9C, a resist pattern is selectively formed over the polycrystal silicon layer 3 by use of the known lithography technique. The polycrystal silicon layer 3 is then patterned into an island shape by an anisotropic etching technique using the resist pattern as a mask. The used resist pattern is then removed.

In the above-described first embodiment, the polycrystal silicon layer 3 is directly subjected to the impurity implantation. This direct exposure to the impurity implantation may allow the polycrystal silicon layer 3 to be damaged in crystal structure. In order to avoid the polycrystal silicon layer 3 from the possibility of damage in the crystal structure, the following addition process is carried out.

Figure 9D:
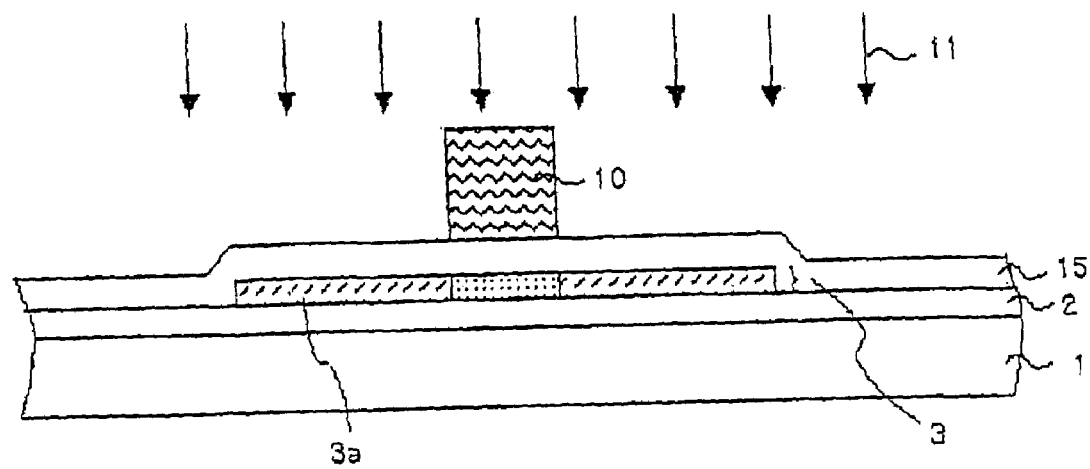

As shown in FIG. 9D, a dummy oxide film 15 is additionally formed over the polycrystal silicon layer 3 and the under-coat layer 2, before another resist pattern 10 is also selectively formed over the dummy oxide film 15. A selective impurity-implantation process is carried out by use of the resist pattern 10 as a mask, so that impurity ions 11 are selectively implanted through the dummy oxide film 15 into the patterned polycrystal silicon layer 3 except under the resist pattern 10, thereby to form high impurity concentration regions 3a in the patterned polycrystal silicon layer 3, except under the resist pattern 10. The impurity may, for example, be phosphorous but not limited thereto. A size of the resist pattern 10 is smaller than an intended gate electrode formation region by a size of lightly activated high impurity concentration layers.

Figure 9E:
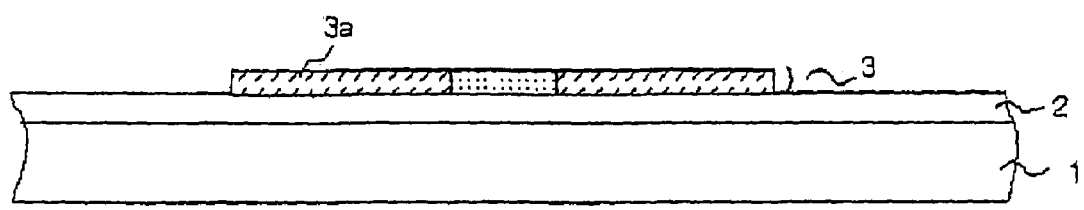

As shown in FIG. 9E, the used resist pattern 10 is then removed. Further, the used dummy oxide film 15 is also removed.

Figure 9F:
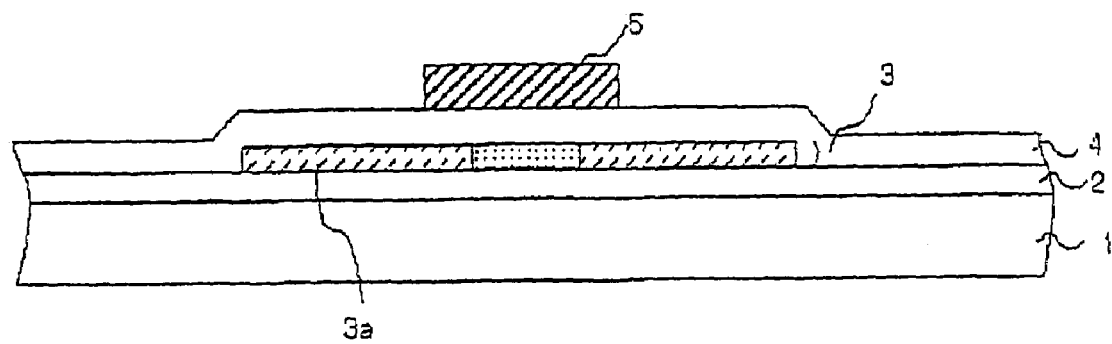

As shown in FIG. 9F, a gate insulating film 4 is then formed over the semiconductor layer 3 and the under-coat layer 2. The gate insulating film 4 may comprise any available insulating film including but not limited to silicon oxide and silicon nitride. The gate insulating film 4 may be formed by one of any available methods such as a low pressure chemical vapor deposition method, a plasma enhanced chemical vapor deposition method and a sputtering method. The thickness of the gate insulating film 4 may advantageously be decided by taking into account a driving condition of the device and a driving voltage. A typical example of the thickness of the gate insulating film 4 may be in the range of 30–200 nm, and preferably 50–100 nm.

Further, a conductive film is deposited over the gate insulating film 4. The conductive film may comprise any available conductive film, for example, a silicide film, a metal film, and an impurity-doped silicon film. The deposition may typically be made by a plasma enhanced chemical vapor deposition method. A typical example of the thickness of the conductive film may be in the range of 200–400 nm. A resist pattern is selectively formed over the conductive film by the know lithography technique. An anisotropic etching process is then carried out by use of the resist pattern as a mask to define the conductive film into a gate electrode 5. Since the resist pattern overlaps predetermined inside regions of the high impurity concentration regions 3a of the semiconductor layer 3, then the gate electrode 5 also overlaps predetermined inside regions of the high impurity concentration regions 3a of the semiconductor layer 3. In this typical example, the above overlap appears symmetrically both the source and drain sides, but it should be noted that the above overlap is needed at least in the drain side. Namely, it is possible that the above overlap appears only in the drain side, or also possible that the above overlap appears asymmetrically both in the source and drain sides. It should also be noted that if the transistor is for the switching transistor utilizing the inversion between the source and drain regions, then the above overlap should appear symmetrically in both the source and drain sides.

Figure 9G:
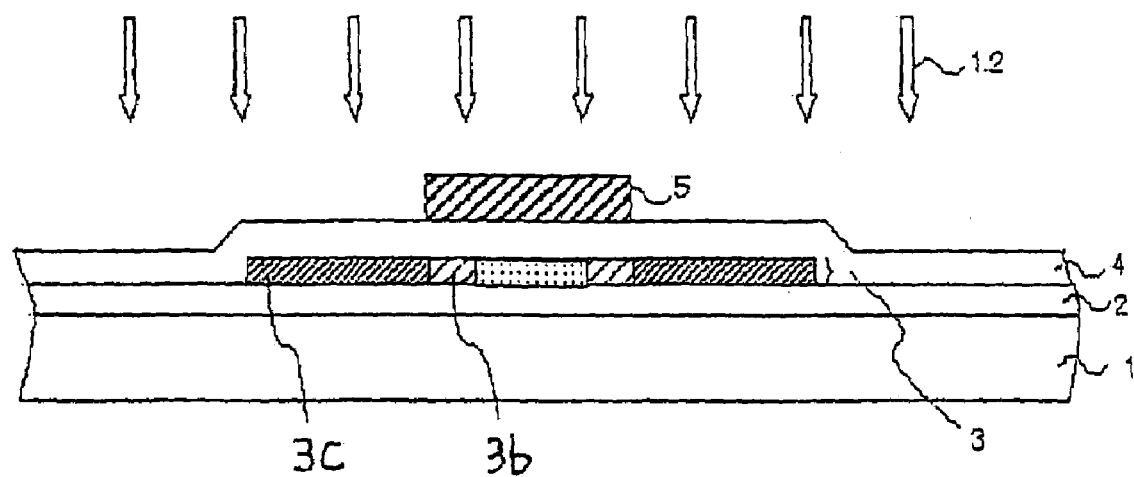

As shown in FIG. 9G, a selective laser irradiation process is then carried out by use of the gate electrode 5 as a mask, so that a laser beam 12 is irradiated through the gate insulating film 4 to the semiconductor layer 3, except under the gate electrode 5 for the purpose of selective activation of the semiconductor layer 3, except under the gate electrode 5. The non-overlapped regions of the semiconductor layer 3 do receive the laser beam irradiation, whereby the non-overlapped regions become sufficiently activated high impurity concentration layers 3c. The impurity in the non-overlapped regions or the sufficiently activated high impurity concentration layers 3c is sufficiently activated and the most of the impurity becomes effectively activated impurity which contributes to the electrical conductivity.

On the other hand, the gate-overlapped regions of the semiconductor layer 3 do not receive the laser beam irradiation but do receive a thermal diffusion from the non-overlapped regions, whereby the gate-overlapped regions become lightly activated high impurity concentration layers 3b. The impurity in the gate-overlapped regions or the lightly activated high impurity concentration layers 3b is insufficiently activated and the minority of the impurity becomes effectively activated impurity which contributes to the electrical conductivity. Namely, the lightly activated high impurity concentration layers 3b has a lower concentration of the effectively activated impurity, which contributes to the electrical conductivity, than the concentration of the implanted-impurity.

Namely, the lightly activated high impurity concentration layers 3b and the sufficiently activated high impurity concentration layers 3c have the same impurity concentration. The impurity implanted in the sufficiently activated high impurity concentration layers 3c are sufficiently activated by direct laser beam irradiation in the lease anneal process. The impurity implanted in the lightly activated high impurity concentration layers 3b are lightly or insufficiently activated by a thermal diffusion from the sufficiently activated high impurity concentration layers 3c. The lightly activated high impurity concentration layers 3b have not received any laser irradiation. Namely, the activation energy for the lightly activated high impurity concentration layers 3b depends on the thermal diffusion from the sufficiently activated high impurity concentration layers 3c, for which reason the activation is insufficient. This insufficient activation depending on the thermal diffusion gives rise to a lower concentration of the effectively activated impurity than the implanted-impurity concentration. The effectively activated impurity only may contribute to provide an electrical conductivity. For those reasons, the lightly activated high impurity concentration layers 3b exhibits substantially the same function as the lightly doped drain regions.

Further, the thermal diffusion into the lightly activated high impurity concentration layers 3b is directed inwardly from the sufficiently activated high impurity concentration layers 3c which have received the laser irradiation in the laser anneal process. For this reason, the heat energy absorbed into the lightly activated high impurity concentration layers 3b may gently or gradually decrease from the outside position near the sufficiently activated high impurity concentration layers 3c to the inside position far from the sufficiently activated high impurity concentration layers 3c. Therefore, the degree of the activation of the impurity may gently or gradually decrease from the outside position near the sufficiently activated high impurity concentration layers 3c to the inside position far from the sufficiently activated high impurity concentration layers 3c. Namely, the concentration profile of the effectively activated impurity may gently or gradually decrease from the outside position near the sufficiently activated high impurity concentration layers 3c to the inside position far from the sufficiently activated high impurity concentration layers 3c.

Accordingly, the concentration profile of the effectively activated impurity across the channel region free of impurity implantation, the lightly activated high impurity concentration layers 3b and the sufficiently activated high impurity concentration layers 3c are free of any step-like variation or any other abrupt and rapid variation, whereby no extensively high field concentration is caused.

The energy of the laser irradiation may be decided by taking into account respective thicknesses of the semiconductor layer 3 and the gate insulating film 4 as well as respective surface reflectivities thereof, and also with reference to an energy which causes semiconductor or silicon of the semiconductor layer 3 to be melt. A typical example of the laser irradiation energy may be in the range of 250–300 mJ, but not limited thereto.

Figure 9H:
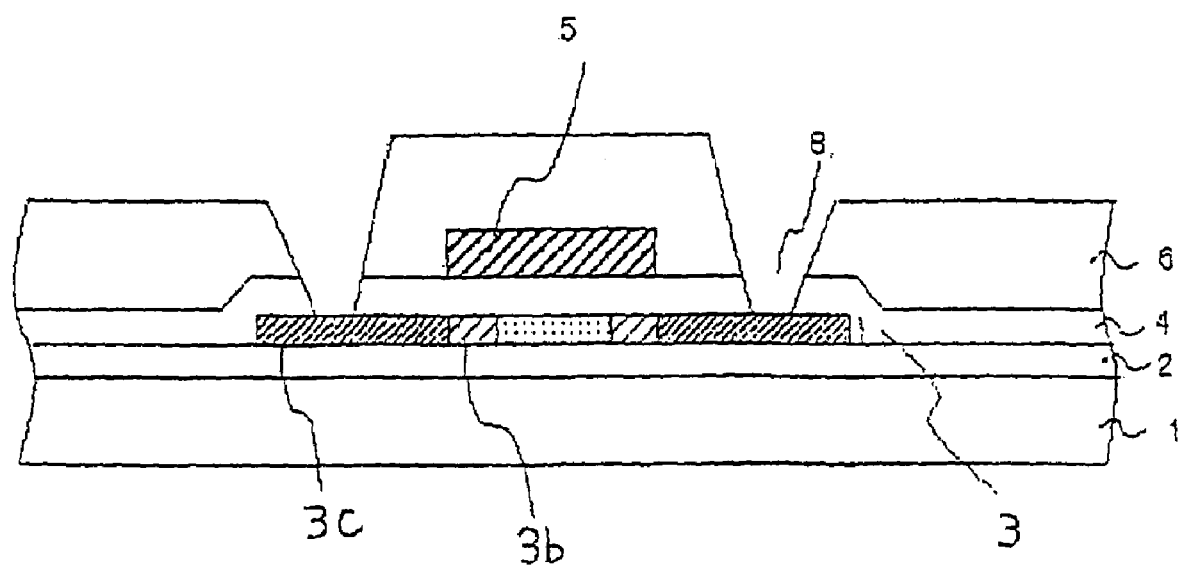

As shown in FIG. 9H, an inter-layer insulator 6 is deposited over the gate electrode 5 and the gate insulating film 4. Contact holes 8 are selectively formed in the inter-layer insulator 6 and the gate insulating film 4 and over the sufficiently activated high impurity concentration layers 3c serving as source and drain regions.

Figure 9I:
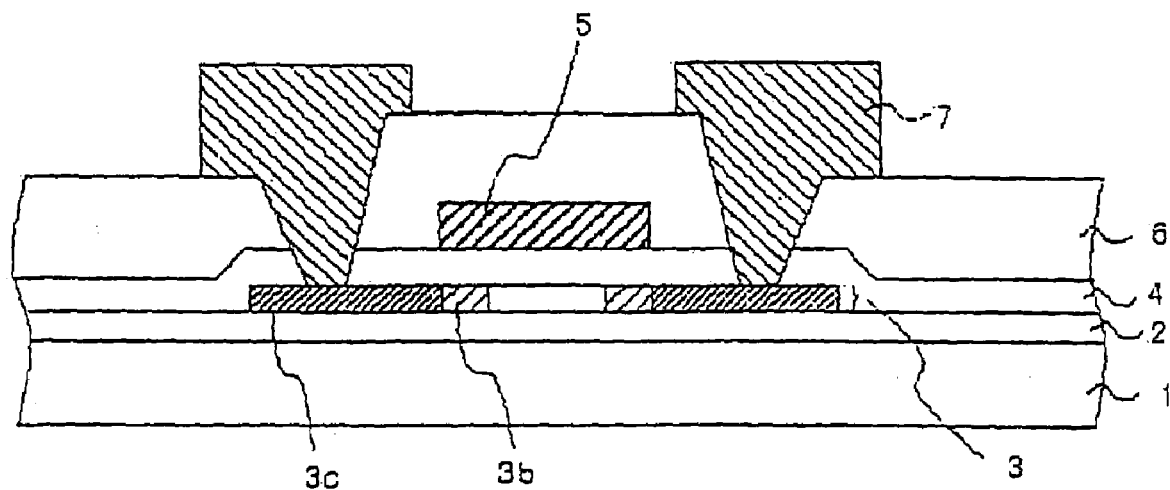

As shown in FIG. 9I, a metal film is also deposited over the inter-layer insulator 6 and within the contact holes 8, so that the metal film is made into contact with the sufficiently activated high impurity concentration layers 3c. The deposition may be made by any available method, for example, a sputtering method. A typical example of the thickness of the metal film may be in the range of 300–1000 nm, but not limited thereto. A typical example of material for the metal film may be aluminum, but not limited thereto. The metal film is then patterned into source and drain electrodes 7 by use of a known lithography technique and a subsequent anisotropic etching process, thereby forming the thin film field effect transistor including the improved gate-overlap-drain structure.

Fourth Embodiment:

A fourth embodiment according to the present invention will be described in detail with reference to the drawings. This fourth embodiment is different from the first embodiment but only parts of the processes for forming the transistor, for which reason the following descriptions will focus on the sequential processes.

FIGS. 10A through 10I are fragmentary cross sectional elevation views of thin film field effect transistors with the improved gate-overlap-drain structure in sequential steps involved in a novel method of forming the transistor in accordance with the fourth embodiment of the present invention.

Figure 10A:
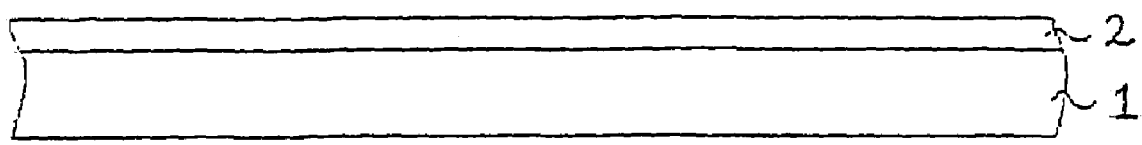
FIGS. 10A through 10I are fragmentary cross sectional elevation views of thin film field effect transistors with the improved gate-overlap-drain structure in sequential steps involved in a novel method of forming the transistor in accordance with the fourth embodiment of the present invention.

As shown in FIG. 10A, a transparent insulating substrate 1 such as a glass substrate 1 is prepared. An under-coat layer 2 is formed over the transparent insulating substrate 1. The under-coat layer 2 may typically have a thickness in the range of 100–500 nm and more preferably about 300 nm. The under-coat layer 2 is provided in order to prevent any further impurity diffusion from the substrate 1 to any overlying layers, for example, a semiconductor layer 3. The under-coat layer 2 is not necessarily needed if the above impurity diffusion is not problem. The under-coat layer 2 may be formed by one of any available methods such as a low pressure chemical vapor deposition method, a plasma enhanced chemical vapor deposition method, a sputtering method and a dipping method. The under-coat layer 2 may typically comprise, but not limited to, any one of a silicon oxide layer, a silicon nitride layer, and laminations thereof.

Figure 10B:
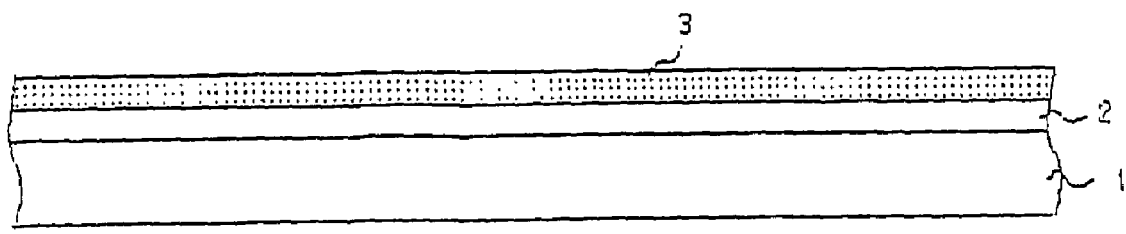

As shown in FIG. 10B, a polycrystal silicon layer 3 is formed over the under-coat layer 2. A typical example of forming the polycrystal silicon layer 3 is that an amorphous silicon layer as a precursor is first formed over the under-coat layer 2, before the amorphous silicon layer is then crystallized by a laser irradiation. The amorphous silicon layer may be formed by one of any available methods such as a low pressure chemical vapor deposition method, a plasma enhanced chemical vapor deposition method and a sputtering method. A typical thickness of the amorphous silicon layer may be in the range of 50–100 nm. Instead of the laser irradiation for crystallization, a solid-state growth method may also be available.

Figure 10C:
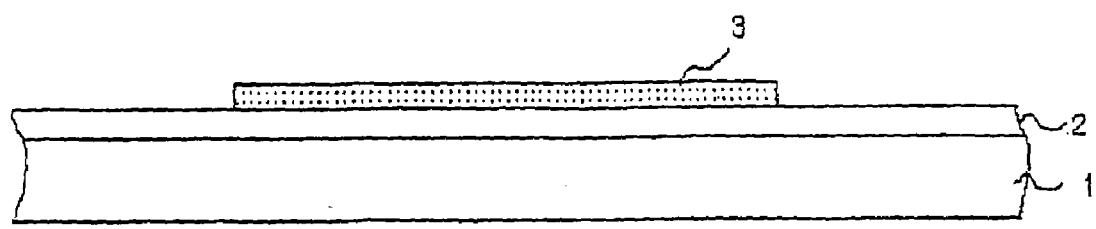

As shown in FIG. 10C, a resist pattern is selectively formed over the polycrystal silicon layer 3 by use of the known lithography technique. The polycrystal silicon layer 3 is then patterned into an island shape by an anisotropic etching technique using the resist pattern as a mask. The used resist pattern is then removed.

In the above-described first embodiment, the polycrystal silicon layer 3 is directly subjected to the impurity implantation. This direct exposure to the impurity implantation may allow the polycrystal silicon layer 3 to be damaged in crystal structure. In order to avoid the polycrystal silicon layer 3 from the possibility of damage in the crystal structure, the following addition process is carried out.

Figure 10D:
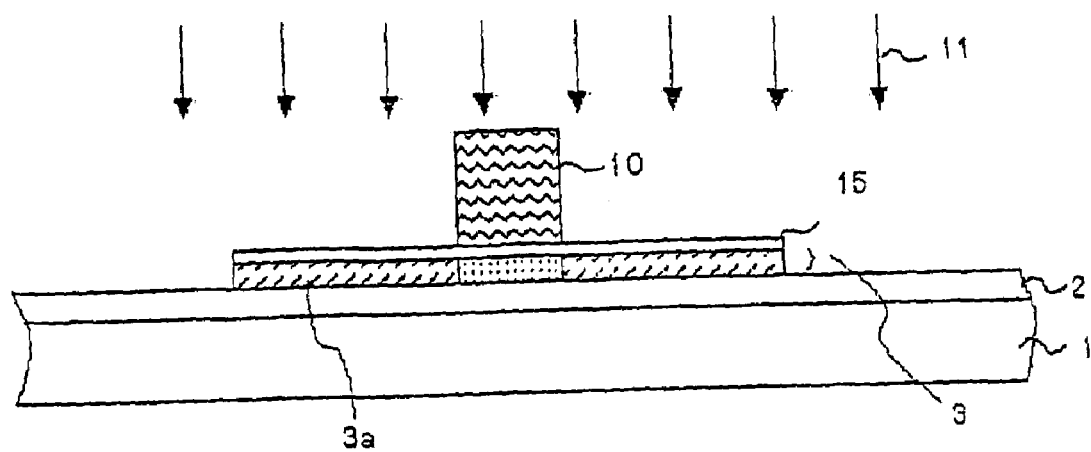

As shown in FIG. 10D, a dummy oxide film 15 is additionally formed over the polycrystal silicon layer 3 and the under-coat layer 2. The dummy oxide film 15 is then selectively removed, so that the dummy oxide film 15 extends only over the polycrystal silicon layer 3. Subsequently, another resist pattern 10 is also selectively formed over the dummy oxide film 15. A selective impurity-implantation process is carried out by use of the resist pattern 10 as a mask, so that impurity ions 11 are selectively implanted through the dummy oxide film 15 into the patterned polycrystal silicon layer 3 except under the resist pattern 10, thereby to form high impurity concentration regions 3a in the patterned polycrystal silicon layer 3, except under the resist pattern 10. The impurity may, for example, be phosphorous but not limited thereto. A size of the resist pattern 10 is smaller than an intended gate electrode formation region by a size of lightly activated high impurity concentration layers.

Figure 10E:
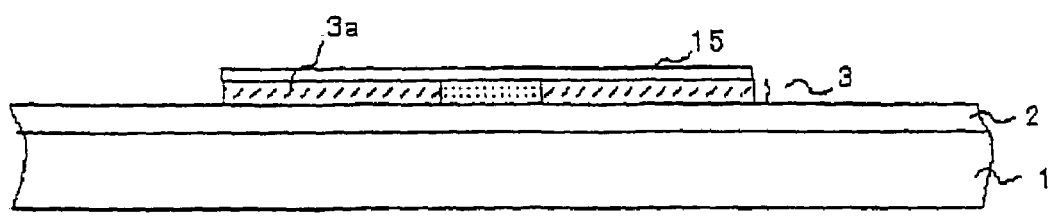

As shown in FIG. 10E, the used resist pattern 10 is then removed, while the used dummy oxide film 15 remains over the semiconductor layer 3.

Figure 10F:
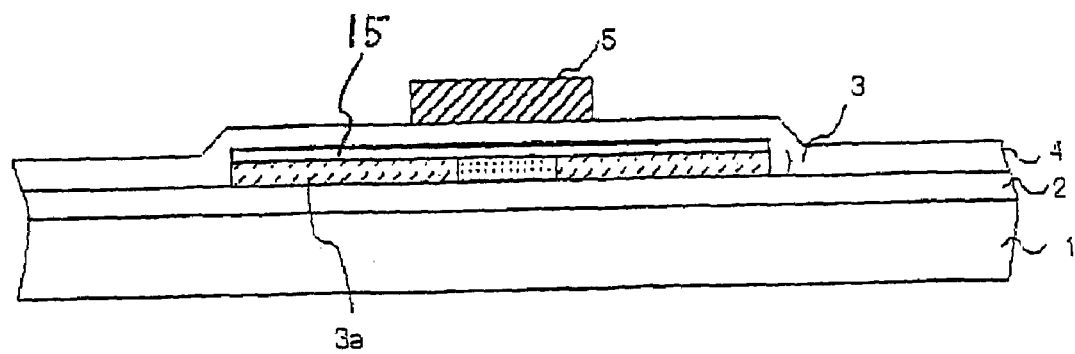

As shown in FIG. 10F, a gate insulating film 4 is then formed over the dummy oxide film 15 and the under-coat layer 2. The gate insulating film 4 may comprise any available insulating film including but not limited to silicon oxide and silicon nitride. The gate insulating film 4 may be formed by one of any available methods such as a low pressure chemical vapor deposition method, a plasma enhanced chemical vapor deposition method and a sputtering method. The thickness of the gate insulating film 4 may advantageously be decided by taking into account a driving condition of the device and a driving voltage. A typical example of the thickness of the gate insulating film 4 may be in the range of 30–200 nm, and preferably 50–100 nm.

Further, a conductive film is deposited over the gate insulating film 4. The conductive film may comprise any available conductive film, for example, a silicide film, a metal film, and an impurity-doped silicon film. The deposition may typically be made by a plasma enhanced chemical vapor deposition method. A typical example of the thickness of the conductive film may be in the range of 200–400 nm. A resist pattern is selectively formed over the conductive film by the know lithography technique. An anisotropic etching process is then carried out by use of the resist pattern as a mask to define the conductive film into a gate electrode 5. Since the resist pattern overlaps predetermined inside regions of the high impurity concentration regions 3a of the semiconductor layer 3, then the gate electrode 5 also overlaps predetermined inside regions of the high impurity concentration regions 3a of the semiconductor layer 3. In this typical example, the above overlap appears symmetrically both the source and drain sides, but it should be noted that the above overlap is needed at least in the drain side. Namely, it is possible that the above overlap appears only in the drain side, or also possible that the above overlap appears asymmetrically both in the source and drain sides. It should also be noted that if the transistor is for the switching transistor utilizing the inversion between the source and drain regions, then the above overlap should appear symmetrically in both the source and drain sides.

Figure 10G:
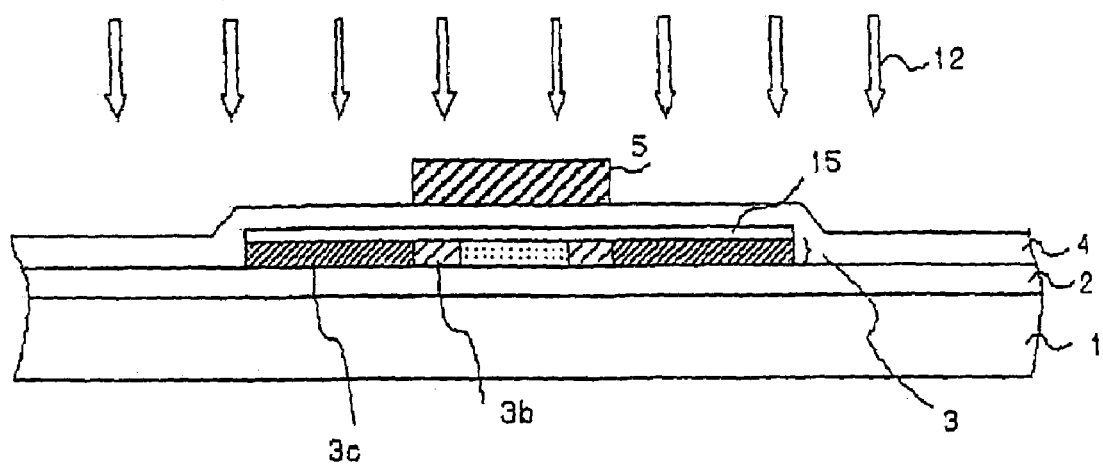

As shown in FIG. 10G a selective laser irradiation process is then carried out by use of the gate electrode 5 as a mask, so that a laser beam 12 is irradiated through the gate insulating film 4 and the dummy oxide film 15 to the semiconductor layer 3, except under the gate electrode 5 for the purpose of selective activation of the semiconductor layer 3, except under the gate electrode 5. The non-overlapped regions of the semiconductor layer 3 do receive the laser beam irradiation, whereby the non-overlapped regions become sufficiently activated high impurity concentration layers 3c. The impurity in the non-overlapped regions or the sufficiently activated high impurity concentration layers 3c is sufficiently activated and the most of the impurity becomes effectively activated impurity which contributes to the electrical conductivity.

On the other hand, the gate-overlapped regions of the semiconductor layer 3 do not receive the laser beam irradiation but do receive a thermal diffusion from the non-overlapped regions, whereby the gate-overlapped regions become lightly activated high impurity concentration layers 3b. The impurity in the gate-overlapped regions or the lightly activated high impurity concentration layers 3b is insufficiently activated and the minority of the impurity becomes effectively activated impurity which contributes to the electrical conductivity. Namely, the lightly activated high impurity concentration layers 3b has a lower concentration of the effectively activated impurity, which contributes to the electrical conductivity, than the concentration of the implanted-impurity.

Namely, the lightly activated high impurity concentration layers 3b and the sufficiently activated high impurity concentration layers 3c have the same impurity concentration. The impurity implanted in the sufficiently activated high impurity concentration layers 3c are sufficiently activated by direct laser beam irradiation in the lease anneal process. The impurity implanted in the lightly activated high impurity concentration layers 3b are lightly or insufficiently activated by a thermal diffusion from the sufficiently activated high impurity concentration layers 3c. The lightly activated high impurity concentration layers 3b have not received any laser irradiation. Namely, the activation energy for the lightly activated high impurity concentration layers 3b depends on the thermal diffusion from the sufficiently activated high impurity concentration layers 3c, for which reason the activation is insufficient. This insufficient activation depending on the thermal diffusion gives rise to a lower concentration of the effectively activated impurity than the implanted-impurity concentration. The effectively activated impurity only may contribute to provide an electrical conductivity. For those reasons, the lightly activated high impurity concentration layers 3b exhibits substantially the same function as the lightly doped drain regions.

Further, the thermal diffusion into the lightly activated high impurity concentration layers 3b is directed inwardly from the sufficiently activated high impurity concentration layers 3c which have received the laser irradiation in the laser anneal process. For this reason, the heat energy absorbed into the lightly activated high impurity concentration layers 3b may gently or gradually decrease from the outside position near the sufficiently activated high impurity concentration layers 3c to the inside position far from the sufficiently activated high impurity concentration layers 3c. Therefore, the degree of the activation of the impurity may gently or gradually decrease from the outside position near the sufficiently activated high impurity concentration layers 3c to the inside position far from the sufficiently activated high impurity concentration layers 3c. Namely, the concentration profile of the effectively activated impurity may gently or gradually decrease from the outside position near the sufficiently activated high impurity concentration layers 3c to the inside position far from the sufficiently activated high impurity concentration layers 3c.

Accordingly, the concentration profile of the effectively activated impurity across the channel region free of impurity implantation, the lightly activated high impurity concentration layers 3b and the sufficiently activated high impurity concentration layers 3c are free of any step-like variation or any other abrupt and rapid variation, whereby no extensively high field concentration is caused.

The energy of the laser irradiation may be decided by taking into account respective thicknesses of the semiconductor layer 3 and the gate insulating film 4 as well as respective surface reflectivities thereof, and also with reference to an energy which causes semiconductor or silicon of the semiconductor layer 3 to be melt. A typical example of the laser irradiation energy may be in the range of 250–300 mJ, but not limited thereto.

Figure 10H:
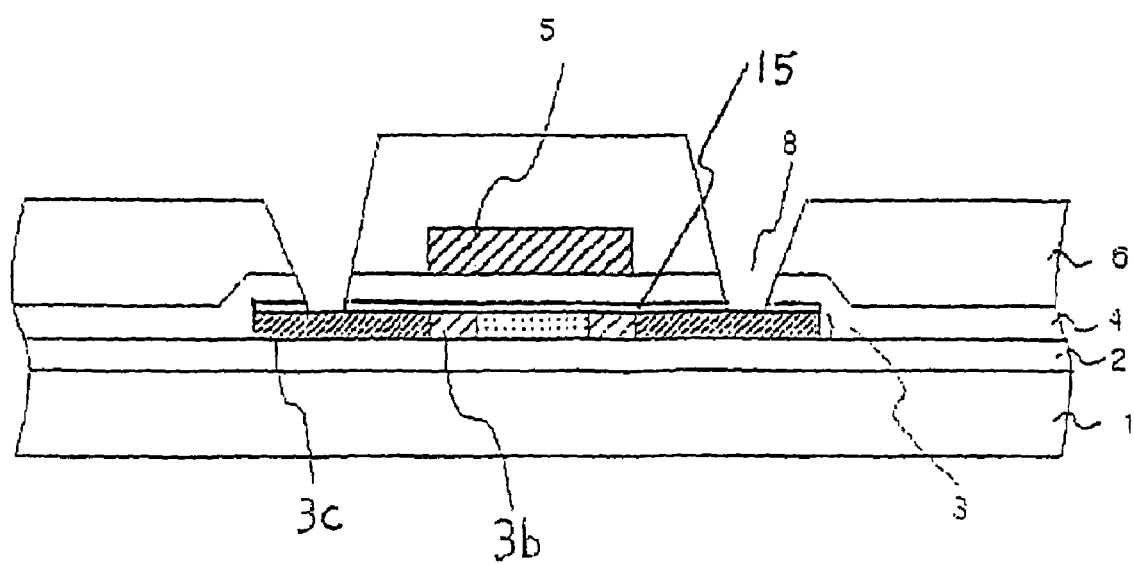

As shown in FIG. 10H, an inter-layer insulator 6 is deposited over the gate electrode 5 and the gate insulating film 4. Contact holes 8 are selectively formed in the inter-layer insulator 6, the gate insulating film 4 and the dummy oxide film 15 but over the sufficiently activated high impurity concentration layers 3c serving as source and drain regions.

Figure 10I:
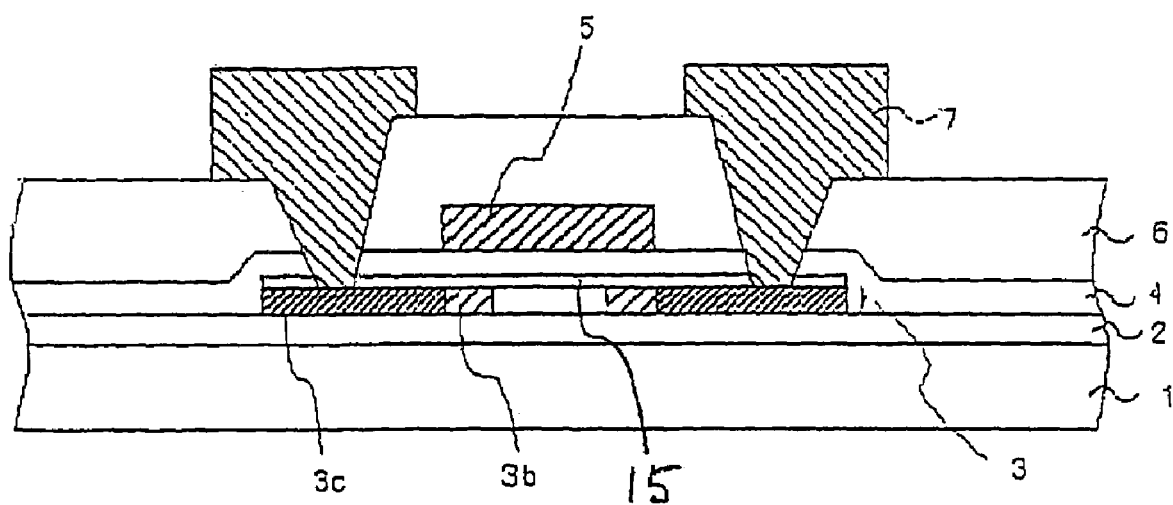

As shown in FIG. 10I, a metal film is also deposited over the inter-layer insulator 6 and within the contact holes 8, so that the metal film is made into contact with the sufficiently activated high impurity concentration layers 3c. The deposition may be made by any available method, for example, a sputtering method. A typical example of the thickness of the metal film may be in the range of 300–1000 nm, but not limited thereto. A typical example of material for the metal film may be aluminum, but not limited thereto. The metal film is then patterned into source and drain electrodes 7 by use of a known lithography technique and a subsequent anisotropic etching process, thereby forming the thin film field effect transistor including the improved gate-overlap-drain structure.

Fifth Embodiment:

A fifth embodiment according to the present invention will be described in detail with reference to the drawings. This fifth embodiment is different from the first embodiment but only parts of the processes for forming the transistor, for which reason the following descriptions will focus on the sequential processes.

FIGS. 11A through 11I are fragmentary cross sectional elevation views of thin film field effect transistors with the improved gate-overlap-drain structure in sequential steps involved in a novel method of forming the transistor in accordance with the fifth embodiment of the present invention.

Figure 11A:
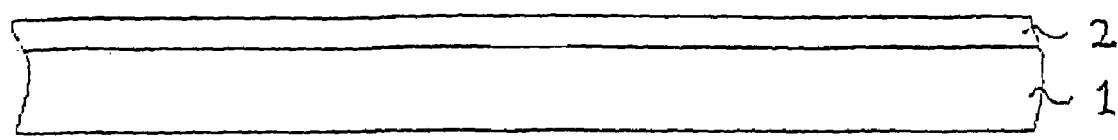
FIGS. 11A through 11I are fragmentary cross sectional elevation views of thin film field effect transistors with the improved gate-overlap-drain structure in sequential steps involved in a novel method of forming the transistor in accordance with the fifth embodiment of the present invention.

As shown in FIG. 11A, a transparent insulating substrate 1 such as a glass substrate 1 is prepared. An under-coat layer 2 is formed over the transparent insulating substrate 1. The under-coat layer 2 may typically have a thickness in the range of 100–500 nm and more preferably about 300 nm. The under-coat layer 2 is provided in order to prevent any further impurity diffusion from the substrate 1 to any overlying layers, for example, a semiconductor layer 3. The under-coat layer 2 is not necessarily needed if the above impurity diffusion is not problem. The under-coat layer 2 may be formed by one of any available methods such as a low pressure chemical vapor deposition method, a plasma enhanced chemical vapor deposition method, a sputtering method and a dipping method. The under-coat layer 2 may typically comprise, but not limited to, any one of a silicon oxide layer, a silicon nitride layer, and laminations thereof.

Figure 11B:
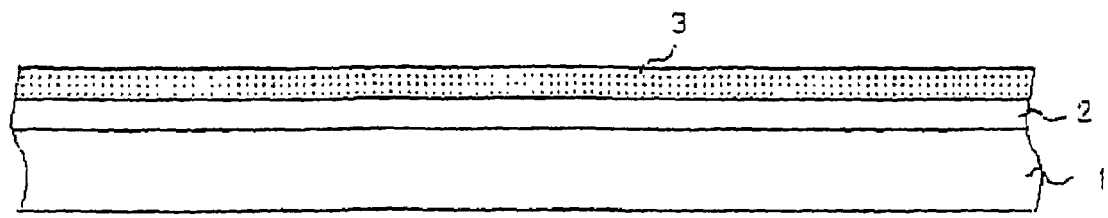

As shown in FIG. 11B, a polycrystal silicon layer 3 is formed over the under-coat layer 2. A typical example of forming the polycrystal silicon layer 3 is that an amorphous silicon layer as a precursor is first formed over the under-coat layer 2, before the amorphous silicon layer is then crystallized by a laser irradiation. The amorphous silicon layer may be formed by one of any available methods such as a low pressure chemical vapor deposition method, a plasma enhanced chemical vapor deposition method and a sputtering method. A typical thickness of the amorphous silicon layer may be in the range of 50–100 nm. Instead of the laser irradiation for crystallization, a solid-state growth method may also be available.

Figure 11C:
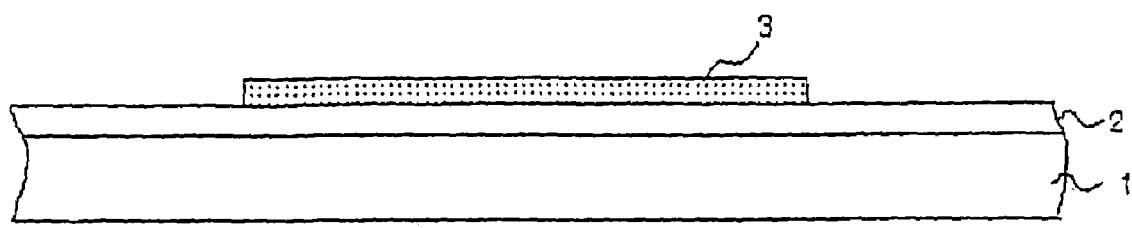

As shown in FIG. 11C, a resist pattern is selectively formed over the polycrystal silicon layer 3 by use of the known lithography technique. The polycrystal silicon layer 3 is then patterned into an island shape by an anisotropic etching technique using the resist pattern as a mask. The used resist pattern is then removed.

In the above-described first embodiment, the polycrystal silicon layer 3 is directly subjected to the impurity implantation. This direct exposure to the impurity implantation may allow the polycrystal silicon layer 3 to be damaged in crystal structure. In order to avoid the polycrystal silicon layer 3 from the possibility of damage in the crystal structure, an additional dummy oxide film is formed which may act as a gate oxide film.

Figure 11D:
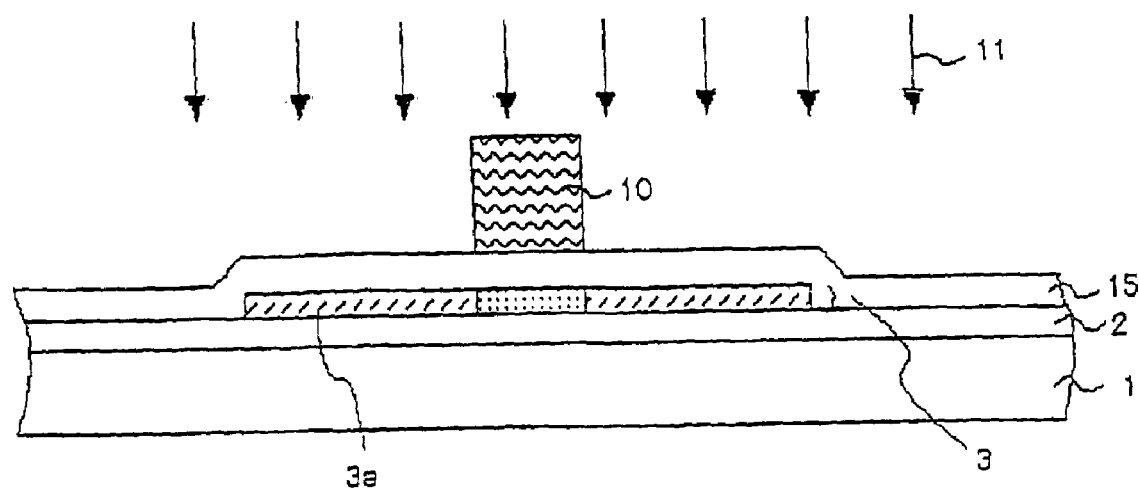

As shown in FIG. 11D, a dummy oxide film 15 is additionally formed over the polycrystal silicon layer 3 and the under-coat layer 2. Subsequently, another resist pattern 10 is also selectively formed over the dummy oxide film 15. A selective impurity-implantation process is carried out by use of the resist pattern 10 as a mask, so that impurity ions 11 are selectively implanted through the dummy oxide film 15 into the patterned polycrystal silicon layer 3 except under the resist pattern 10, thereby to form high impurity concentration regions 3a in the patterned polycrystal silicon layer 3, except under the resist pattern 10. The impurity may, for example, be phosphorous but not limited thereto. A size of the resist pattern 10 is smaller than an intended gate electrode formation region by a size of lightly activated high impurity concentration layers.

Figure 11E:
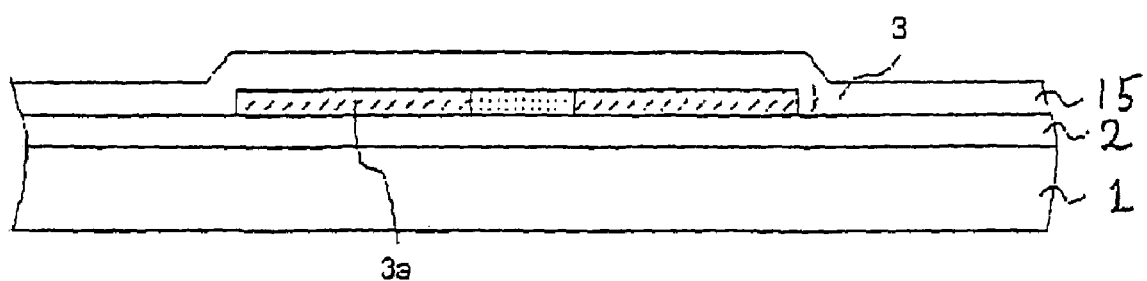

As shown in FIG. 11E, the used resist pattern 10 is then removed, while the used dummy oxide film 15 remains over the semiconductor layer 3 because the used dummy oxide film 15 will act as a gate insulating film, for which reason the dummy oxide film 15 will hereinafter refereed to as a gate insulating film 15.

Figure 11F:
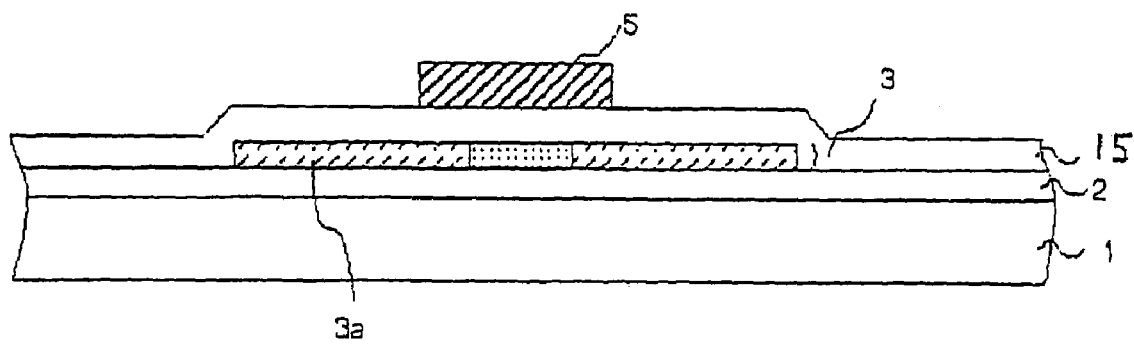

As shown in FIG. 11F, a conductive film is deposited over the gate insulating film 15. The conductive film may comprise any available conductive film, for example, a silicide film, a metal film, and an impurity-doped silicon film. The deposition may typically be made by a plasma enhanced chemical vapor deposition method. A typical example of the thickness of the conductive film may be in the range of 200–400 nm. A resist pattern is selectively formed over the conductive film by the know lithography technique. An anisotropic etching process is then carried out by use of the resist pattern as a mask to define the conductive film into a gate electrode 5. Since the resist pattern overlaps predetermined inside regions of the high impurity concentration regions 3a of the semiconductor layer 3, then the gate electrode 5 also overlaps predetermined inside regions of the high impurity concentration regions 3a of the semiconductor layer 3. In this typical example, the above overlap appears symmetrically both the source and drain sides, but it should be noted that the above overlap is needed at least in the drain side. Namely, it is possible that the above overlap appears only in the drain side, or also possible that the above overlap appears asymmetrically both in the source and drain sides. It should also be noted that if the transistor is for the switching transistor utilizing the inversion between the source and drain regions, then the above overlap should appear symmetrically in both the source and drain sides.

Figure 11G:
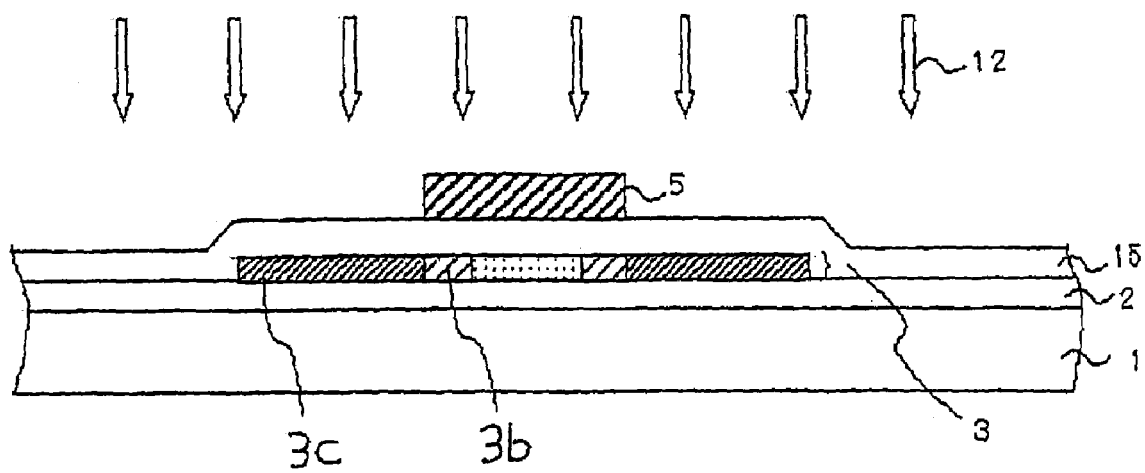

As shown in FIG. 11G, a selective laser irradiation process is then carried out by use of the gate electrode 5 as a mask, so that a laser beam 12 is irradiated through the gate insulating film 15 and the dummy oxide film 15 to the semiconductor layer 3, except under the gate electrode 5 for the purpose of selective activation of the semiconductor layer 3, except under the gate electrode 5. The non-overlapped regions of the semiconductor layer 3 do receive the laser beam irradiation, whereby the non-overlapped regions become sufficiently activated high impurity concentration layers 3c. The impurity in the non-overlapped regions or the sufficiently activated high impurity concentration layers 3c is sufficiently activated and the most of the impurity becomes effectively activated impurity which contributes to the electrical conductivity.

On the other hand, the gate-overlapped regions of the semiconductor layer 3 do not receive the laser beam irradiation but do receive a thermal diffusion from the non-overlapped regions, whereby the gate-overlapped regions become lightly activated high impurity concentration layers 3b. The impurity in the gate-overlapped regions or the lightly activated high impurity concentration layers 3b is insufficiently activated and the minority of the impurity becomes effectively activated impurity which contributes to the electrical conductivity. Namely, the lightly activated high impurity concentration layers 3b has a lower concentration of the effectively activated impurity, which contributes to the electrical conductivity, than the concentration of the implanted-impurity.

Namely, the lightly activated high impurity concentration layers 3b and the sufficiently activated high impurity concentration layers 3c have the same impurity concentration. The impurity implanted in the sufficiently activated high impurity concentration layers 3c are sufficiently activated by direct laser beam irradiation in the lease anneal process. The impurity implanted in the lightly activated high impurity concentration layers 3b are lightly or insufficiently activated by a thermal diffusion from the sufficiently activated high impurity concentration layers 3c. The lightly activated high impurity concentration layers 3b have not received any laser irradiation. Namely, the activation energy for the lightly activated high impurity concentration layers 3b depends on the thermal diffusion from the sufficiently activated high impurity concentration layers 3c, for which reason the activation is insufficient. This insufficient activation depending on the thermal diffusion gives rise to a lower concentration of the effectively activated impurity than the implanted-impurity concentration. The effectively activated impurity only may contribute to provide an electrical conductivity. For those reasons, the lightly activated high impurity concentration layers 3b exhibits substantially the same function as the lightly doped drain regions.

Further, the thermal diffusion into the lightly activated high impurity concentration layers 3b is directed inwardly from the sufficiently activated high impurity concentration layers 3c which have received the laser irradiation in the laser anneal process. For this reason, the heat energy absorbed into the lightly activated high impurity concentration layers 3b may gently or gradually decrease from the outside position near the sufficiently activated high impurity concentration layers 3c to the inside position far from the sufficiently activated high impurity concentration layers 3c. Therefore, the degree of the activation of the impurity may gently or gradually decrease from the outside position near the sufficiently activated high impurity concentration layers 3c to the inside position far from the sufficiently activated high impurity concentration layers 3c. Namely, the concentration profile of the effectively activated impurity may gently or gradually decrease from the outside position near the sufficiently activated high impurity concentration layers 3c to the inside position far from the sufficiently activated high impurity concentration layers 3c.

Accordingly, the concentration profile of the effectively activated impurity across the channel region free of impurity implantation, the lightly activated high impurity concentration layers 3b and the sufficiently activated high impurity concentration layers 3c are free of any step-like variation or any other abrupt and rapid variation, whereby no extensively high field concentration is caused.

The energy of the laser irradiation may be decided by taking into account respective thicknesses of the semiconductor layer 3 and the gate insulating film 15 as well as respective surface reflectivities thereof, and also with reference to an energy which causes semiconductor or silicon of the semiconductor layer 3 to be melt. A typical example of the laser irradiation energy may be in the range of 250–300 mJ, but not limited thereto.

Figure 11H:
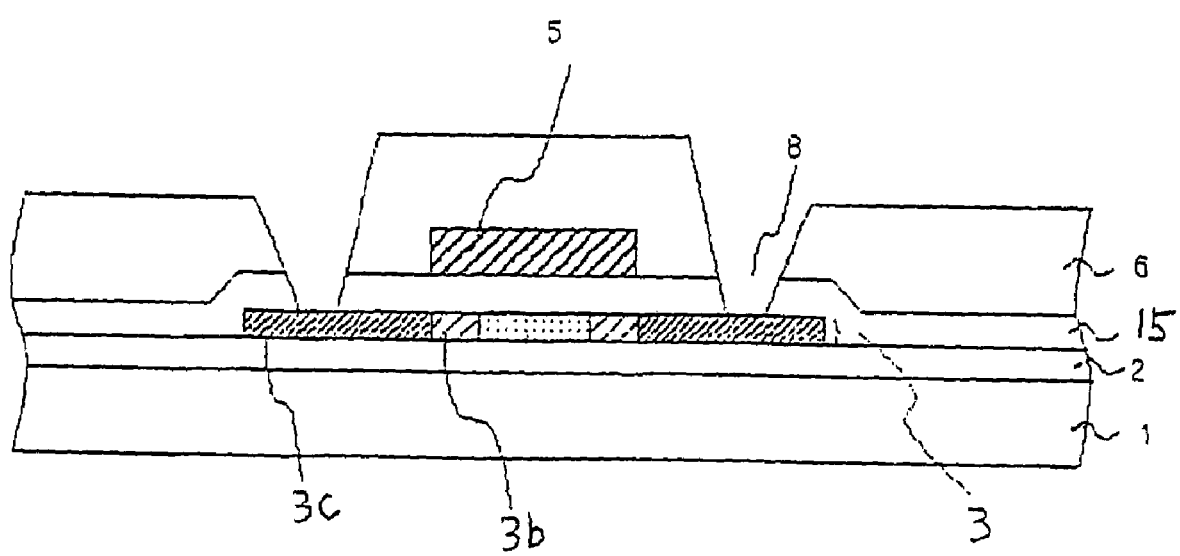

As shown in FIG. 11H, an inter-layer insulator 6 is deposited over the gate electrode 5 and the gate insulating film 15. Contact holes 8 are selectively formed in the inter-layer insulator 6 and the gate insulating film 15 but over the sufficiently activated high impurity concentration layers 3c serving as source and drain regions.

Figure 11I:
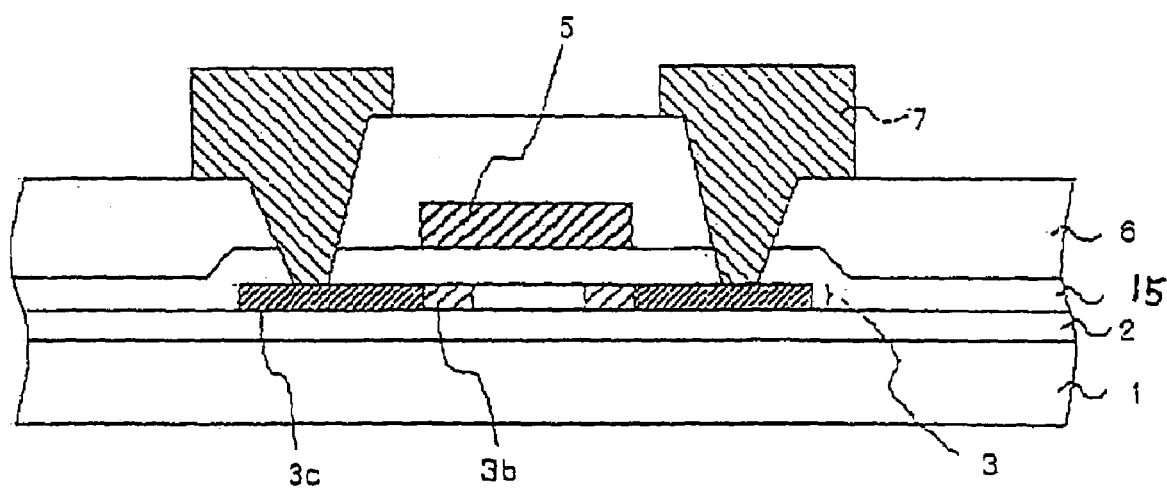

As shown in FIG. 11I, a metal film is also deposited over the inter-layer insulator 6 and within the contact holes 8, so that the metal film is made into contact with the sufficiently activated high impurity concentration layers 3c. The deposition may be made by any available method, for example, a sputtering method. A typical example of the thickness of the metal film may be in the range of 300–1000 nm, but not limited thereto. A typical example of material for the metal film may be aluminum, but not limited thereto. The metal film is then patterned into source and drain electrodes 7 by use of a known lithography technique and a subsequent anisotropic etching process, thereby forming the thin film field effect transistor including the improved gate-overlap-drain structure.

In accordance with the present embodiment, since the dummy oxide film 15 used in the impurity-implantation process is further re-used as the gate insulating film 15, for which reason no process for forming the gate insulating film is needed.

Figure 12:
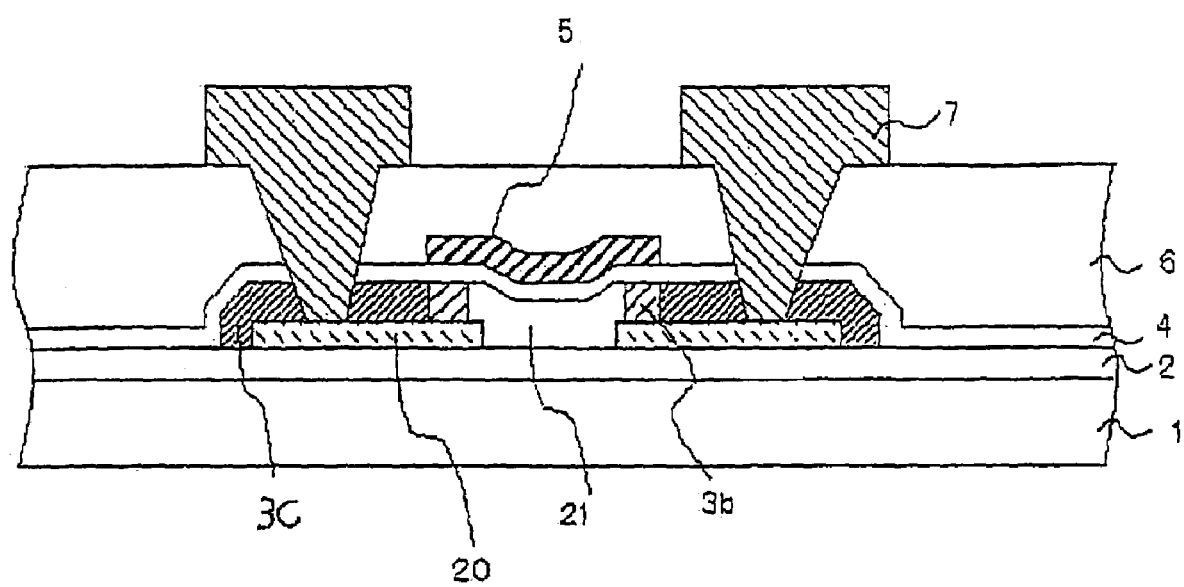
FIG. 12 is a fragmentary cross sectional elevation view of a novel thin film field effect transistor with an improved gate-overlap-drain structure in accordance with the sixth embodiment of the present invention.

Sixth Embodiment:

A sixth embodiment according to the present invention will be described in detail with reference to the drawings. FIG. 12 is a fragmentary cross sectional elevation view of a novel thin film field effect transistor with an improved gate-overlap-drain structure in accordance with the sixth embodiment of the present invention. In the first, third, fourth and fifth embodiments, the planer-structured thin film field effect transistors have been provided. In this sixth embodiment, however, a staggered thin film field effect transistor is provided, wherein source and drain electrodes underlie the source and drain regions, above which a gate electrode is positioned.

A staggered thin film field effect transistor is provided over a glass substrate 1. An under-coat layer 2 overlies the glass substrate 1. Source/drain electrodes 20 are selectively provided over the under-coat layer 2. A semiconductor layer 3 is selectively provided over the source/drain electrodes 20 and also over the under-coat layer 2 but between the source/drain electrodes 20 and in the vicinity of the outside edges of the source/drain electrodes 20. The semiconductor layer further comprises an amorphous silicon channel layer 21, lightly activated high impurity concentration layers 3b in contact directly with opposite sides of the amorphous silicon channel layer 21, and sufficiently activated high impurity concentration layers 3c in contact directly with outsides of the lightly activated high impurity concentration layers 3b. A gate insulating film 4 extends over the semiconductor layer 3 and the under-coat layer 2.

A gate electrode 5 is selectively provided over the gate insulating film 4. The lightly activated high impurity concentration layers 3b are positioned under the gate electrode 5, so that the lightly activated high impurity concentration layers 3b are covered by the gate electrode 5. The sufficiently activated high impurity concentration layers 3c are positioned under outsides of the gate electrode 5, so that the sufficiently activated high impurity concentration layers 3c are not covered by the gate electrode 5. Respective boundaries between the sufficiently activated high impurity concentration layers 3c and the lightly activated high impurity concentration layers 3b are self-aligned to the opposite side-edges of the gate electrode 5.

An inter-layer insulator 6 extends over the gate electrode 5 and the gate insulating film 4. Contact holes are provided in laminations of the sufficiently activated high impurity concentration layers 3c, the gate insulating film 4 and the inter-layer insulator 6 but over the source/drain electrodes 20. Source/drain electrodes 7 are selectively provided in the contact holes and over the inter-layer insulator 6, so that the source/drain electrodes 7 are in contact with the source/drain electrodes 20. The sufficiently activated high impurity concentration layers 3c serve as source/drain regions.

The lightly activated high impurity concentration layers 3b and the sufficiently activated high impurity concentration layers 3c have the same impurity concentration. The impurity implanted in the sufficiently activated high impurity concentration layers 3c are sufficiently activated by direct laser beam irradiation in the lease anneal process. The impurity implanted in the lightly activated high impurity concentration layers 3b are lightly or insufficiently activated by a thermal diffusion from the sufficiently activated high impurity concentration layers 3c. The lightly activated high impurity concentration layers 3b have not received any laser irradiation. Namely, the activation energy for the lightly activated high impurity concentration layers 3b depends on the thermal diffusion from the sufficiently activated high impurity concentration layers 3c, for which reason the activation is insufficient. This insufficient activation depending on the thermal diffusion gives rise to a lower concentration of the effectively activated impurity than the implanted-impurity concentration. The effectively activated impurity only may contribute to provide an electrical conductivity. For those reasons, the lightly activated high impurity concentration layers 3b exhibits substantially the same function as the lightly doped drain regions.

Further, the thermal diffusion into the lightly activated high impurity concentration layers 3b is directed inwardly from the sufficiently activated high impurity concentration layers 3c which have received the laser irradiation in the laser anneal process. For this reason, the heat energy absorbed into the lightly activated high impurity concentration layers 3b may gently or gradually decrease from the outside position near the sufficiently activated high impurity concentration layers 3c to the inside position far from the sufficiently activated high impurity concentration layers 3c. Therefore, the degree of the activation of the impurity may gently or gradually decrease from the outside position near the sufficiently activated high impurity concentration layers 3c to the inside position far from the sufficiently activated high impurity concentration layers 3c. Namely, the concentration profile of the effectively activated impurity may gently or gradually decrease from the outside position near the sufficiently activated high impurity concentration layers 3c to the inside position far from the sufficiently activated high impurity concentration layers 3c. Accordingly, the concentration profile of the effectively activated impurity across the channel region 3a, the lightly activated high impurity concentration layers 3b and the sufficiently activated high impurity concentration layers 3c are free of any step-like variation or any other abrupt and rapid variation, whereby no extensively high field concentration is caused. This concentration profile of the effectively activated impurity prevents traps of the hot carriers and thus allow a long carrier life-time.

Similarly to the foregoing embodiments, the above improved gate-overlap-drain structure may also be formed by a single pair of a single impurity implantation process and a later single laser anneal process for selective activation. The impurity implantation process is carried out by using a resist pattern having a smaller size than the gate electrode 5 as a mask to form high impurity concentration regions which include both the lightly activated high impurity concentration layers 3b and the sufficiently activated high impurity concentration layers 3c. After the gate electrode 5 is formed, then the single laser anneal process is carried out by using the gate electrode as a mask for selective activation of the high impurity concentration regions, whereby the laser-irradiated regions non-overlapped and non-covered by the gate electrode 5 are sufficiently activated and become the sufficiently activated high impurity concentration layers 3c, while the laser-irradiation-free regions overlapped and covered by the gate electrode 5 are insufficiently activated by the thermal diffusion from the laser-irradiated regions and become the lightly activated high impurity concentration layers 3b.

In the foregoing embodiments, the entirety of the substrate is subjected to the laser anneal. It is, of course, possible to irradiate the laser beam onto one or more selected or localized regions. It is also possible to utilize laser anneal processes under various conditions for causing a variety of the activation degree.

Although the invention has been described above in connection with several preferred embodiments therefor, it will be appreciated that those embodiments have been provided solely for illustrating the invention, and not in a limiting sense. Numerous modifications and substitutions of equivalent materials and techniques will be readily apparent to those skilled in the art after reading the present application, and all such modifications and substitutions are expressly understood to fall within the true scope and spirit of the appended claims.

What is claimed is:

1. A method of forming a semiconductor structure in a field effect transistor, comprising the steps of:
    selectively forming a resist pattern over a first selected region of a semiconductor layer;
    carrying out a selective impurity-implantation by use of said resist pattern as a mask for selectively implanting an impurity into said semiconductor layer except under said resist pattern at a first implanted-impurity concentration, to define at least an impurity-implanted region in said semiconductor layer;
    removing said resist pattern from said semiconductor layer;
    selectively forming a gate electrode over a second selected region of said semiconductor layer, and said second selected region completely encompassing said first selected region and also encompassing an outside region adjacent to a periphery of said first selected region, and at least a gate-overlapped part of said at least an impurity-implanted region being covered by said gate electrode, while a remaining non-overlapped part of said at least an impurity-implanted region being not covered by said gate electrode; and
    carrying out a selective laser beam irradiation to said remaining non-overlapped part by use of said gate electrode as a mask, whereby said remaining non-overlapped part is sufficiently activated upon said selective laser beam irradiation and said remaining non-overlapped part becomes at least a sufficiently activated high impurity concentration layer, while said at least a gate-overlapped part is insufficiently activated by a thermal diffusion from said remaining non-overlapped part, and said at least a gate-overlapped part becomes at least a lightly activated high impurity concentration layer.

2. The method as claimed in claim 1, wherein said at least a lightly activated high impurity concentration layer has a first implanted-impurity concentration value, and a first effectively-activated-impurity concentration range which is lower than said first implanted-impurity concentration value; and
    said at least a sufficiently activated high impurity concentration layer is bounded with said at least a lightly activated high impurity concentration layer, and said at least a sufficiently activated high impurity concentration layer has a second implanted-impurity concentration value which is substantially the same as said first implanted-impurity concentration value, and a second effectively-activated-impurity concentration value which is higher than said first effectively-activated-impurity concentration range.

3. The method as claimed in claim 2, wherein a boundary between said at least a lightly activated high impurity concentration layer and said at least a sufficiently activated high impurity concentration layer is aligned to an edge of said gate electrode.

4. The method as claimed in claim 3, wherein said at least a lightly activated high impurity concentration layer has a gentle decrease in a first effectively-activated-impurity concentration value ranged in said first effectively-activated-impurity concentration range as a distance from said at least a sufficiently activated high impurity concentration layer is increased.

5. The method as claimed in claim 1, further including the step of forming a dummy layer over at least an entirety of said semiconductor layer before selectively forming a resist pattern over said dummy layer for selectively implanting said impurity through said dummy layer into said semiconductor layer in said selective impurity implantation.

6. The method as claimed in claim 5, further including the steps of:
    removing said dummy layer in addition to said removal of said resist pattern; and
    forming a gate insulating film prior to said step of selectively forming said gate electrode over said gate insulating film.

7. The method as claimed in claim 5, further including the step of having said dummy layer remain as said gate insulating film, so that said gate electrode is selectively formed over said dummy layer as said gate insulating film.

8. A method of forming a semiconductor structure in a field effect transistor, comprising the steps of:
    carrying out a selective impurity-implantation for selectively implanting an impurity into a semiconductor layer, to define at least an impurity-implanted region in said semiconductor layer; and
    carrying out a selective laser beam irradiation to at least a selected part of said at least an impurity-implanted region, whereby said at least a selected part of said at least an impurity-implanted region is sufficiently activated upon said selective laser beam irradiation, and said at least a selected part becomes at least a sufficiently activated high impurity concentration layer, while a remaining non-selected part of said at least an impurity-implanted region is insufficiently activated by a thermal diffusion from said at least a selected part, and said remaining non-selected part becomes at least a lightly activated high impurity concentration layer.

9. The method as claimed in claim 8, wherein said at least a lightly activated high impurity concentration layer has a first implanted-impurity concentration value, and a first effectively-activated-impurity concentration range which is lower than said first implanted-impurity concentration value; and
    said at least a sufficiently activated high impurity concentration layer is bounded with said at least a lightly activated high impurity concentration layer, and said at least a sufficiently activated high impurity concentration layer has a second implanted-impurity concentration value which is substantially the same as said first implanted-impurity concentration value, and a second effectively-activated-impurity concentration value which is higher than said first effectively-activated-impurity concentration range.

10. The method as claimed in claim 9, wherein a boundary between said at least a lightly activated high impurity concentration layer and said at least a sufficiently activated high impurity concentration layer is aligned to an edge of said gate electrode.

11. The method as claimed in claim 10, wherein said at least a lightly activated high impurity concentration layer has a gentle decrease in a first effectively-activated-impurity concentration value ranged in said first effectively-activated-impurity concentration range as a distance from said at least a sufficiently activated high impurity concentration layer is increased.

* * * * *

UNITED STATES PATENT AND TRADEMARK OFFICE
CERTIFICATE OF CORRECTION

| | | |
|---|---|---|
| PATENT NO. | : 7,015,084 B2 | Page 1 of 1 |
| APPLICATION NO. | : 10/893298 | |
| DATED | : March 21, 2006 | |
| INVENTOR(S) | : Kenji Sera | |

It is certified that error appears in the above-identified patent and that said Letters Patent is hereby corrected as shown below:

Title Page;

Under REFERENCES CITED at (56):

Add the following references:
 US6,001,714
 US5,485,019

Signed and Sealed this
Sixth Day of September, 2011

David J. Kappos
*Director of the United States Patent and Trademark Office*